United States Patent
Kobayashi et al.

(10) Patent No.: US 12,534,617 B2
(45) Date of Patent: Jan. 27, 2026

(54) RESIN COMPOSITION, CURED PRODUCT, PREPREG, METAL FOIL-CLAD LAMINATE, RESIN SHEET, AND PRINTED WIRING BOARD

(71) Applicant: Mitsubishi Gas Chemical Company, Inc, Tokyo (JP)

(72) Inventors: Takashi Kobayashi, Tokyo (JP); Kazuhiro Hashiguchi, Tokyo (JP); Keiichi Hasebe, Tokyo (JP)

(73) Assignee: Mitsubishi Gas Chemical Company, Inc., Tokyo (JP)

( * ) Notice: Subject to any disclaimer, the term of this patent is extended or adjusted under 35 U.S.C. 154(b) by 578 days.

(21) Appl. No.: 17/801,773

(22) PCT Filed: Feb. 24, 2021

(86) PCT No.: PCT/JP2021/006752
§ 371 (c)(1),
(2) Date: Aug. 23, 2022

(87) PCT Pub. No.: WO2021/172317
PCT Pub. Date: Sep. 2, 2021

(65) Prior Publication Data
US 2023/0106050 A1   Apr. 6, 2023

(30) Foreign Application Priority Data
Feb. 25, 2020 (JP) .................. 2020-029910
Sep. 24, 2020 (JP) .................. 2020-159938

(51) Int. Cl.
| | | |
|---|---|---|
| C08L 79/08 | (2006.01) | |
| B32B 15/09 | (2006.01) | |
| B32B 27/20 | (2006.01) | |
| B32B 27/36 | (2006.01) | |
| C08J 5/24 | (2006.01) | |
| H05K 1/03 | (2006.01) | |

(52) U.S. Cl.
CPC .............. C08L 79/08 (2013.01); B32B 15/09 (2013.01); B32B 27/20 (2013.01); B32B 27/36 (2013.01); C08J 5/24 (2013.01); H05K 1/0366 (2013.01); *B32B 2457/00* (2013.01)

(58) Field of Classification Search
CPC ........ C08L 79/08; C08L 79/085; B32B 27/36; C08J 5/24
See application file for complete search history.

(56) References Cited

U.S. PATENT DOCUMENTS

| | | | |
|---|---|---|---|
| 5,399,715 | A | 3/1995 | Naitoh et al. |
| 10,550,244 | B2 * | 2/2020 | Kobayashi .............. C08L 63/00 |
| 10,689,512 | B2 | 6/2020 | Liu et al. |
| 2008/0300350 | A1 | 12/2008 | Ohno et al. |
| 2009/0017316 | A1 * | 1/2009 | Kato ..................... B32B 15/14 |
| | | | 428/447 |
| 2009/0203279 | A1 | 8/2009 | Mori et al. |
| 2014/0235126 | A1 | 8/2014 | Mori et al. |
| 2017/0231090 | A1 | 8/2017 | Kobayashi et al. |
| 2017/0313854 | A1 | 11/2017 | Kobayashi et al. |
| 2018/0208765 | A1 | 7/2018 | Liu et al. |

(Continued)

FOREIGN PATENT DOCUMENTS

| | | |
|---|---|---|
| CN | 101314630 A | 12/2008 |
| CN | 107001767 A | 8/2017 |

(Continued)

OTHER PUBLICATIONS

ACS Omega, Phosphinated Poly(aryl ether)s with Acetic/Phenyl Methacrylic/Vinylbenzyl Ether Moieties for High-Tg and Low-Dielectric Thermosets; Chien-Han Chen, et al., (2018) (8 pp).

(Continued)

*Primary Examiner* — Gregory Listvoyb
(74) *Attorney, Agent, or Firm* — Renner, Kenner; Arthur M. Reginelli

(57) ABSTRACT

Provided is a resin composition having high thermal resistance and low dielectric properties, as well as a cured product, a prepreg, a metal foil-clad laminate, a resin sheet, and a printed wiring board. The resin composition contains a compound (A) represented by Formula (M1) and a cyanate ester compound (B) containing two or more aromatic moieties per molecule, the aromatic moieties being replaced by at least one cyanato group: where in Formula (M1), A is a four- to six-membered alicyclic group:

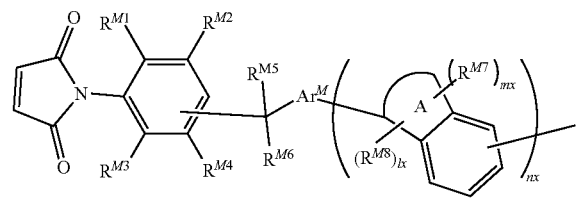

(M1)

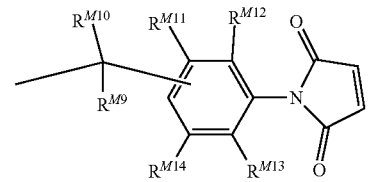

22 Claims, No Drawings

(56) References Cited

U.S. PATENT DOCUMENTS

| | | |
|---|---|---|
| 2021/0032404 A1 | 2/2021 | Shigaki et al. |
| 2021/0214547 A1 | 7/2021 | Honda et al. |
| 2023/0098357 A1 | 3/2023 | Hirano et al. |
| 2023/0101507 A1 | 3/2023 | Kobayashi et al. |

FOREIGN PATENT DOCUMENTS

| | | |
|---|---|---|
| CN | 107148452 A | 9/2017 |
| CN | 113748149 A | 12/2021 |
| CN | 113748152 A | 12/2021 |
| JP | H05247202 A | 9/1993 |
| JP | 2009-001783 A | 1/2009 |
| JP | 2009-161725 A | 7/2009 |
| JP | 2010-138364 A | 6/2010 |
| TW | 201827509 A | 8/2018 |
| TW | 678390 B | 12/2019 |
| WO | 1993/12933 A1 | 7/1993 |
| WO | 2016/125657 A1 | 8/2016 |
| WO | 2016/072404 A1 | 4/2017 |
| WO | 2019/138992 A1 | 1/2020 |
| WO | 2019/230945 A1 | 6/2020 |
| WO | 2020/217674 A1 | 10/2020 |
| WO | 2020/217676 A1 | 10/2020 |
| WO | 2021149733 A1 | 7/2021 |
| WO | 2020/217675 A1 | 12/2021 |

OTHER PUBLICATIONS

CN Office Action dated Nov. 18, 2023 in corresponding Chinese application No. 202180016312.X (9 pp).

International Search Report and Opinion for corresponding PCT/JP2021/006752 (10 pp).

International Preliminary Report of Patentability for corresponding PCT/JP2021/006752 (6 pp) with English Translation (5 pp).

Office Action dated Oct. 11, 2024 issues in related Taiwanese Patent Appliation No. 110106390 (co-pending with U.S. Appl. No. 17/901,752).

Notice of Reasons for Refusal dated Dec. 17, 2024 issued in the related Japanese Patent Application No. 2022-503629.

Office Action dated Oct. 16, 2025 in related Korean Patent Application No. 10-2022-7029181 (English translation not available).

\* cited by examiner

RESIN COMPOSITION, CURED PRODUCT, PREPREG, METAL FOIL-CLAD LAMINATE, RESIN SHEET, AND PRINTED WIRING BOARD

TECHNICAL FIELD

The present invention relates to a resin composition, a cured product, a prepreg, a metal foil-clad laminate, a resin sheet, and a printed wiring board.

BACKGROUND ART

In recent years, semiconductors used in equipment such as communication tools, communication devices, and personal computers have become highly integrated and grown extremely smaller in size, and along with such a tread, various properties required for printed wiring boards (e.g., metal foil-clad laminates) for use in such equipment have become increasingly stringent. Examples of the main properties required include metal foil peel strength, low water absorption, desmear resistance, flame resistance, low dielectric constant, low dielectric loss tangent, low thermal expansion coefficient, and thermal resistance.

To obtain a printed wiring board having each of these property improved, resin compositions used as a material for the printed wiring board have been studied. For example, Patent Document 1 discloses a resin composition for a printed wiring board, the composition containing a bifunctional vinylbenzyl compound (a) containing a given poly (phenylene ether) skeleton, a predetermined maleimide compound (b), a predetermined cyanate ester resin (c), and a predetermined epoxy resin (d).

In addition, Patent Document 2 discloses a resin composition containing a predetermined cyanate ester compound (A), a predetermined polymaleimide compound (B), and a filler (C) as constituent components.

Furthermore, Patent Document 3 discloses a resin composition containing a predetermined polymaleimide compound (A), a modified poly(phenylene ether) (B) terminally modified with a substituent containing a unsaturated carbon-carbon double bond, and a filler (C).

CITATION LIST

Patent Documents

Patent Document 1: JP 2010-138364 A
Patent Document 2: WO 2016/072404
Patent Document 3: WO 2019/138992

SUMMARY OF INVENTION

Technical Problem

As described above, various resin compositions for printed wiring boards have been studied. Also, along with recent technological innovations, a resin composition that is particularly excellent in thermal resistance and dielectric properties is in need among other requirements in demand.

The present invention is intended to solve such an issue and is to provide a resin composition having high thermal resistance and low water dielectric properties, as well as a cured product, a prepreg, a metal foil-clad laminate, a resin sheet, and a printed wiring board. In particular, an object of the present invention is to provide a resin composition suitable for printed wiring board applications.

Solution to Problem

As a result of studies conducted by the present inventor to solve the above issue, the issue has been solved by the following means.

(1) A resin composition containing a compound (A) represented by Formula (M1) and a cyanate ester compound (B) containing two or more aromatic moieties per molecule, the aromatic moieties being replaced by at least one cyanato group:

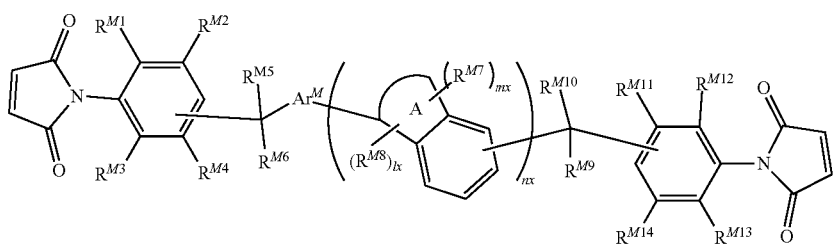

(M1)

wherein Formula (M1), $R^{M1}$, $R^{M2}$, $R^{M3}$, and $R^{M4}$ each independently represent a hydrogen atom or an organic group; $R^{M5}$ and $R^{M6}$ each independently represent a hydrogen atom or an alkyl group; $Ar^M$ represents a divalent aromatic group; A is a four- to six-membered alicyclic group; $R^{M7}$ and $R^{M8}$ are each independently an alkyl group; mx is 1 or 2; lx is 0 or 1; $R^{M9}$ and $R^{M10}$ each independently represent a hydrogen atom or an alkyl group; $R^{M11}$, $R^{M12}$, $R^{M13}$, and $R^{M14}$ each independently represent a hydrogen atom or an organic group; and nx represents an integer of 1 or greater and 20 or less.

(2) The resin composition according to (1), wherein the compound (A) represented by Formula (M1) is contained in an amount from 1 to 90 parts by mass when a resin solid content in the resin composition is 100 parts by mass.

(3) The resin composition according to (1) or (2), wherein a content of the cyanate ester compound (B) containing two or more aromatic moieties per molecule, the aromatic moieties being replaced by at least one cyanato group, is contained in an amount from 1 to 90 parts by mass when a resin solid content in the resin composition is 100 parts by mass.

(4) The resin composition according to any one of (1) to (3), further containing a filler (D).

(5) The resin composition according to (4), wherein the filler (D) is contained in the resin composition in an amount from 50 to 1600 parts by mass per 100 parts by mass of the resin solid content.
(6) The resin composition according to any one of (1) to (5), wherein the cyanate ester compound (B) containing two or more aromatic moieties per molecule, the aromatic moieties being replaced by at least one cyanato group, contains at least one selected from the group consisting of: a phenol novolac-type cyanate ester compound; a naphthol aralkyl-type cyanate ester compound; a naphthylene ether-type cyanate ester compound; a bisphenol A-type cyanate ester compound; a bisphenol M-type cyanate ester compound; and a diallyl bisphenol A-type cyanate ester compound.
(7) The resin composition according to any one of (1) to (6), for a printed wiring board.
(8) A cured product of the resin composition described in any one of (1) to (7).
(9) A prepreg formed from a substrate and the resin composition described in any one of (1) to (7).
(10) A metal foil-clad laminate including at least one prepreg described in (9) and a metal foil disposed on one side or both sides of the prepreg.
(11) A resin sheet including a support and a layer formed from the resin composition described in any one of (1) to (7), the resin composition being disposed on a surface of the support.
(12) A printed wiring board including an insulating layer and a conductor layer, the conductor layer being disposed on a surface of the insulating layer, wherein the insulating layer includes at least one of: a layer formed from the resin composition described in any one of (1) to (7); or a layer formed from the prepreg described in (9).

Advantageous Effects of Invention

The present invention enabled to provide a resin composition having high thermal resistance and low dielectric properties, as well as a cured product, a prepreg, a metal foil-clad laminate, a resin sheet, and a printed wiring board. In particular, the present invention enabled to provide a resin composition suitable for printed wiring board applications.

DESCRIPTION OF EMBODIMENTS

Hereinafter, embodiments for implementing the present invention (hereinafter referred to simply as "the present embodiment") will be described in detail. The present embodiments below are examples for describing the present invention, and the present invention is not limited to the present embodiments.

In the present specification, "from . . . to . . ." or "of . . . to . . ." is used to mean that the numerical values described before and after "to" are included as the lower limit and the upper limit, respectively.

In the present specification, various physical property values and characteristic values are at 23° C. unless otherwise noted.

In a description of a group (atomic group) in the present specification, a description not specifying whether the group is a substituted group or an unsubstituted group is meant to include a group (atomic group) containing a substituent as well as a group (atomic group) containing no substituent. For example, an "alkyl group" includes not only an alkyl group containing no substituent (unsubstituted alkyl group) but also an alkyl group containing a substituent (substituted alkyl group). In the present specification, a description not specifying whether the group is a substituted group or an unsubstituted group means that the group is preferably an unsubstituted group.

"Parts by mass" in the present specification indicates a relative amount of a component, and "mass %" indicates an absolute amount of a component.

In the present specification, a "resin solid content" refers to components excluding a filler and a solvent and is intended to include a compound represented by Formula (M1) and a cyanate ester compound (B) containing two or more aromatic moieties per molecule, the aromatic moieties being replaced by at least one cyanato group, as well as other resin component (C), and an elastomer, a silane coupling agent, and other component (such as an additive, such as a flame retardant) that are blended as necessary.

A resin composition according to the present embodiment is characterized by containing a compound (A) represented by Formula (M1) and a cyanate ester compound (B) containing two or more aromatic moieties per molecule, the aromatic moieties being replaced by at least one cyanato group (which may be referred to as the "specific cyanate ester compound" in the present specification).

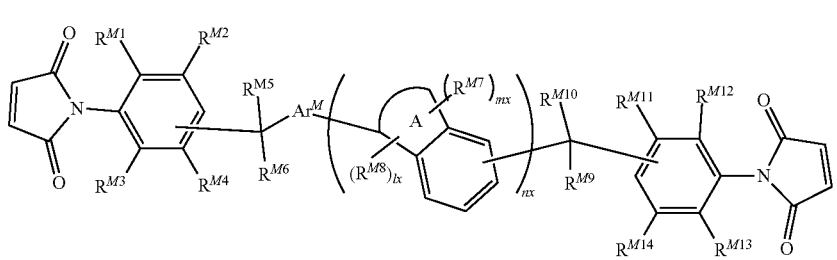

(M1)

In Formula (M1), $R^{M1}$, $R^{M2}$, $R^{M3}$, and $R^{M4}$ each independently represent a hydrogen atom or an organic group; $R^{M5}$ and $R^{M6}$ each independently represent a hydrogen atom or an alkyl group; $Ar^M$ represents a divalent aromatic group; A is a four- to six-membered alicyclic group; $R^{M7}$ and $R^{M8}$ are each independently an alkyl group; mx is 1 or 2; lx is 0 or 1; $R^{M9}$ and $R^{M10}$ each independently represent a hydrogen atom or an alkyl group; $R^{M11}$, $R^{M12}$, $R^{M13}$, and $R^{M14}$ each independently represent a hydrogen atom or an organic group; and nx represents an integer of 1 or greater and 20 or less.

Using such a resin composition will provide a cured product of the resin composition with high thermal resistance and low dielectric properties (an excellent low dielectric constant and/or low dielectric loss tangent). Such a resin composition can be preferably used as a material for a printed wiring board.

The reason for the high thermal resistance and low dielectric properties of the cured product of the resin composition according to the present embodiment is presumed to sented by Formula (M1) has an alicyclic structure, which reduces the polarity of the compound and can make the compound less likely to attract water.

Hereinafter, the compound represented by Formula (M1) will be described.

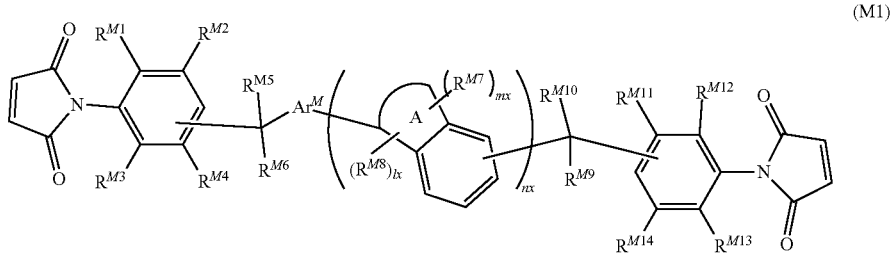

(M1)

be as follows. That is, in the present embodiment, a compound (compound represented by Formula (M1)) containing two maleimide groups and a fused ring of an alicyclic ring and an aromatic ring, such as an indan ring, is used, and this presumably provides the cured product of the resin composition, the cured product having low dielectric properties. Furthermore, the combined use with the specific cyanate ester compound (B) presumably provides the cured product of the resin composition having excellent thermal resistance. Moreover, the compound represented by Formula (M1) is presumed to have an appropriate distance between the maleimide groups in the molecule, and thus this presumably can appropriately cure the resin composition and provides the cured product of the resin composition, the cured product having lower dielectric properties and excellent thermal resistance.

Compound (A) Represented by Formula (M1)

The resin composition according to the present embodiment contains the compound (A) represented by Formula (M1). The compound represented by Formula (M1) has two maleimide groups per molecule, thus the compounds (A) represented by Formula (M1) react with each other to form a cured product, and the compound (A) represented by Formula (M1) reacts with the specific cyanate ester compound (B) to form a cured product and furthermore reacts with another curable resin component (e.g., an "other resin component (C)" described later) to form a cured product, thus forming cured products as well as a cured product formed by the specific cyanate ester compounds (B) with each other. In addition, employing the compound (A) represented by Formula (M1) provides an appropriate distance between the maleimide groups (distance between the cross-linking points). Thus, in the resin composition according to the present embodiment, the fused ring structures of the alicyclic ring and the aromatic ring, such as the indan ring, contained in the compound (A) represented by Formula (M1) are present at appropriate distances in the cured product, and this presumably can achieve the low dielectric properties and high thermal resistance.

Furthermore, the cured product of the resin composition according to the present embodiment contains the compound (A) represented by Formula (M1) and thus can well maintain the dielectric properties also after moisture absorption. In general, when the cured product of this type of resin composition absorbs moisture, the dielectric properties deteriorate. However, the part A in the compound (A) repre- In Formula (M1), $R^{M1}$, $R^{M2}$, $R^{M3}$, and $R^{M4}$ each independently represent a hydrogen atom or an organic group; $R^{M5}$ and $R^{M6}$ each independently represent a hydrogen atom or an alkyl group; $Ar^M$ represents a divalent aromatic group; A is a four- to six-membered alicyclic group; $R^{M7}$ and $R^{M8}$ are each independently an alkyl group; mx is 1 or 2; lx is 0 or 1; $R^{M9}$ and $R^{M10}$ each independently represent a hydrogen atom or an alkyl group; $R^{M11}$, $R^{M12}$, $R^{M13}$, and $R^{M14}$ each independently represent a hydrogen atom or an organic group; and nx represents an integer of 1 or greater and 20 or less.

$R^{M1}$, $R^{M2}$, $R^{M3}$, and $R^{M4}$ in the formula each independently represent a hydrogen atom or an organic group. The organic group here is preferably an alkyl group, more preferably an alkyl group containing from 1 to 12 carbon atom(s), even more preferably an alkyl group containing from 1 to 6 carbon atom(s), still more preferably a methyl group, an ethyl group, a propyl group, or a butyl group, and particularly preferably a methyl group among them. $R^{M1}$ and $R^{M3}$ each independently are preferably alkyl groups, and $R^{M2}$ and $R^{M4}$ are preferably hydrogen atoms.

$R^{M5}$ and $R^{M6}$ each independently represent a hydrogen atom or an alkyl group and are preferably alkyl groups. The alkyl group here is preferably an alkyl group containing from 1 to 12 carbon atom(s), more preferably an alkyl group containing from 1 to 6 carbon atom(s), even more preferably a methyl group, an ethyl group, a propyl group, or a butyl group, and particularly preferably a methyl group among them.

$Ar^M$ represents a divalent aromatic group and is preferably a phenylene group, a naphthalenediyl group, a phenanthrenediyl group, or an anthracenediyl group, more preferably a phenylene group, and even more preferably a m-phenylene group. $Ar^M$ may have a substituent, and the substituent is preferably an alkyl group, more preferably an alkyl group containing from 1 to 12 carbon atom(s), even more preferably an alkyl group containing from 1 to 6 carbon atom(s), still more preferably a methyl group, an ethyl group, a propyl group, or a butyl group, and particularly preferably a methyl group. However, $Ar^M$ is preferably unsubstituted.

A is a four- to six-membered alicyclic group and more preferably a five-membered alicyclic group (preferably a group to form an indan ring with a benzene ring). $R^{M7}$ and $R^{M8}$ each independently are alkyl groups, preferably alkyl groups containing from 1 to 6 carbon atom(s), more preferably alkyl groups containing from 1 to 3 carbon atom(s), and particularly preferably methyl groups. mx is 1 or 2 and preferably 2. lx is 0 or 1 and preferably 1.

$R^{M9}$ and $R^{M10}$ each independently represent a hydrogen atom or an alkyl group and are preferably alkyl groups. The alkyl group here is preferably an alkyl group containing from 1 to 12 carbon atom(s), more preferably an alkyl group containing from 1 to 6 carbon atom(s), even more preferably a methyl group, an ethyl group, a propyl group, or a butyl group, and particularly preferably a methyl group among them.

$R^{M11}$, $R^{M12}$, $R^{M13}$, and $R^{M14}$ each independently represent a hydrogen atom or an organic group. The organic group here is preferably an alkyl group, more preferably an alkyl group containing from 1 to 12 carbon atom(s), even more preferably an alkyl group containing from 1 to 6 carbon atom(s), still more preferably a methyl group, an ethyl group, a propyl group, or a butyl group, and particularly preferably a methyl group among them. $R^{M12}$ and $R^{M13}$ each independently are preferably alkyl groups, and $R^{M11}$ and $R^{M14}$ are preferably hydrogen atoms.

nx represents an integer of 1 or greater and 20 or less. nx may be an integer of 10 or less.

The resin composition of the present invention may contain only one compound (A) represented by Formula (M1) differing in the value of at least nx or may contain two or more compounds (A). When the resin composition contains two or more compounds (A), the average value (average repeating unit number) n of nx in the compound (A) represented by Formula (M1) in the resin composition is preferably 0.95 or higher, more preferably 0.98 or higher, even more preferably 1.0 or higher, and still more preferably 1.1 or higher, and preferably 10.0 or lower, more preferably 8.0 or lower, even more preferably 7.0 or lower, and still more preferably 6.0 or lower to lower the melting point (softening point), reduce the melt viscosity, and provide excellent handling properties. The same applies to Formula (M2) and Formula (M3) described below.

The compound represented by Formula (M1) is preferably a compound represented by Formula (M2) below:

The organic group here is preferably an alkyl group, more preferably an alkyl group containing from 1 to 12 carbon atom(s), even more preferably an alkyl group containing from 1 to 6 carbon atom(s), still more preferably a methyl group, an ethyl group, a propyl group, or a butyl group, and particularly preferably a methyl group. $R^{M21}$ and $R^{M23}$ are preferably alkyl groups, and $R^{M22}$ and $R^{M24}$ are preferably hydrogen atoms.

$R^{M25}$ and $R^{M26}$ each independently represent a hydrogen atom or an alkyl group and are preferably alkyl groups. The alkyl group here is preferably an alkyl group containing from 1 to 12 carbon atom(s), more preferably an alkyl group containing from 1 to 6 carbon atom(s), even more preferably a methyl group, an ethyl group, a propyl group, or a butyl group, and particularly preferably a methyl group among them.

$R^{M27}$, $R^{M28}$, $R^{M29}$, and $R^{M30}$ each independently represent a hydrogen atom or an organic group and are preferably hydrogen atoms. The organic group here is preferably an alkyl group, more preferably an alkyl group containing from 1 to 12 carbon atom(s), even more preferably an alkyl group containing from 1 to 6 carbon atom(s), still more preferably a methyl group, an ethyl group, a propyl group, or a butyl group, and particularly preferably a methyl group.

$R^{M31}$ and $R^{M32}$ each independently represent a hydrogen atom or an alkyl group and are preferably alkyl groups. The alkyl group here is preferably an alkyl group containing from 1 to 12 carbon atom(s), more preferably an alkyl group containing from 1 to 6 carbon atom(s), even more preferably a methyl group, an ethyl group, a propyl group, or a butyl group, and particularly preferably a methyl group among them.

$R^{M33}$, $R^{M34}$, $R^{M35}$, and $R^{M36}$ each independently represent a hydrogen atom or an organic group. The organic group here is preferably an alkyl group, more preferably an alkyl group containing from 1 to 12 carbon atom(s), even more preferably an alkyl group containing from 1 to 6 carbon atom(s), still more preferably a methyl group, an ethyl group, a propyl group, or a butyl group, and particu-

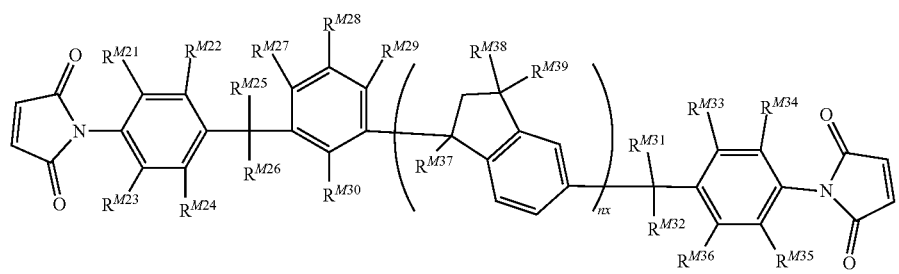

(M2)

where in Formula (M2), $R^{M21}$, $R^{M22}$, $R^{M23}$, and $R^{M24}$ each independently represent a hydrogen atom or an organic group; $R^{M25}$ and $R^{M26}$ each independently represent a hydrogen atom or an alkyl group; $R^{M27}$, $R^{M28}$, $R^{M29}$, and $R^{M30}$ each independently represent a hydrogen atom or an organic group; $R^{M31}$ and $R^{M32}$ each independently represent a hydrogen atom or an alkyl group; $R^{M33}$, $R^{M34}$, $R^{M35}$, and $R^{M36}$ each independently represent a hydrogen atom or an organic group; $R^{M37}$, $R^{M38}$, and $R^{M39}$ each independently represent a hydrogen atom or an alkyl group; and nx represents an integer of 1 or greater and 20 or less.

$R^{M21}$, $R^{M22}$, $R^{M23}$, and $R^{M24}$ in the formula each independently represent a hydrogen atom or an organic group.

larly preferably a methyl group. $R^{M33}$ and $R^{M36}$ are preferably hydrogen atoms, and $R^{M34}$ and $R^{M35}$ are preferably alkyl groups.

$R^{M37}$, $R^{M38}$, and $R^{M39}$ each independently represent a hydrogen atom or an alkyl group and are preferably alkyl groups. The alkyl group here is preferably an alkyl group containing from 1 to 12 carbon atom(s), more preferably an alkyl group containing from 1 to 6 carbon atom(s), even more preferably a methyl group, an ethyl group, a propyl group, or a butyl group, and particularly preferably a methyl group among them.

nx represents an integer of 1 or greater and 20 or less. nx may be an integer of 10 or less.

The compound represented by Formula (M2) is preferably a compound of Formula (M3) below:

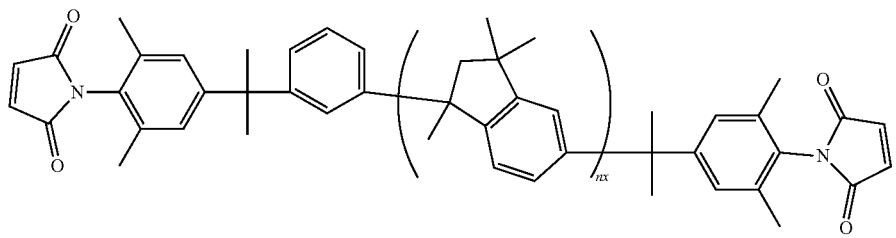

(M3)

where in Formula (M3), nx represents an integer of 1 or more and 20 or less.

nx may be an integer of 10 or less.

The molecular weight of the compound (A) represented by Formula (M1) is preferably 500 or greater, more preferably 600 or greater, and even more preferably 700 or greater. With the molecular weight being not less than the above lower limit, the dielectric properties (low dielectric properties) and low water absorption of the resulting cured product tend to further improve. The molecular weight of the compound (A) represented by Formula (M1) is preferably 10000 or less, more preferably 9000 or less, even more preferably 7000 or less, still more preferably 5000 or less, and yet more preferably 4000 or less. With the molecular weight being not greater than the above upper limit, the thermal resistance and handling properties of the resulting cured product tend to further improve.

In addition, the cured product of the compound (A) represented by Formula (M1) used in the present embodiment preferably has excellent dielectric properties. For example, the cured product of the compound (A) represented by Formula (M1) used in the present embodiment has a dielectric constant (Dk) measured according to a cavity resonance perturbation method of preferably 3.0 or lower and more preferably 2.6 or lower. Furthermore, the lower limit of the dielectric constant is, for example, practically 2.0 or higher. In addition, the cured product of the compound (A) represented by Formula (M1) used in the present embodiment has a dielectric loss tangent (Df) measured according to a cavity resonance perturbation method of preferably 0.01 or lower and more preferably 0.007 or lower. Furthermore, the lower limit of the dielectric loss tangent is, for example, practically 0.0001 or higher.

In addition, the cured product of the compound (A) represented by Formula (M1) used in the present embodiment preferably has high thermal resistance. The cured product of the compound (A) represented by Formula (M1) used in the present embodiment has a glass transition temperature measured in accordance with the JIS C 6481: 1996 dynamic viscoelasticity measurement of preferably 180° C. or higher, more preferably 200° C. or higher, and even more preferably 230° C. or higher. With the glass transition temperature being not lower than the above lower limit, a cured product with even better thermal resistance is obtained. In addition, the upper limit of the glass transition temperature is practically 400° C. or lower.

For the compound (A) represented by Formula (M1) used in the present embodiment, for example, X9-450 or X9-470 available from DIC Corporation can be used.

In the resin composition according to the present embodiment, the content of the compound (A) represented by Formula (M1) above is preferably from 1 to 90 parts by mass when the resin solid content in the resin composition is 100 parts by mass. The lower limit of the content of the compound (A) represented by Formula (M1) is preferably 5 parts by mass or greater, more preferably 10 parts by mass or greater, even more preferably 20 parts by mass or greater, still more preferably 30 parts by mass or greater, yet more preferably 40 parts by mass or greater, and may be 45 parts by mass or greater when a resin solid content in the resin composition is 100 parts by mass. With the content of the compound (A) being not lower than the above lower limit, the chemical resistance and thermal resistance of the resulting cured product tends to further improve. In addition, the upper limit of the content of the compound (A) represented by Formula (M1) is preferably 88 parts by mass or less, more preferably 85 parts by mass or less, even more preferably 83 parts by mass or less, still more preferably 80 parts by mass or less, and may be 70 parts by mass or less, 60 parts by mass or less, or 55 parts by mass or less when the resin solid content in the resin composition is 100 parts by mass. With the content of the compound (A) being not higher than the above upper limit, the water absorption and thermal resistance of the resulting cured product tends to further improve.

In addition, in the resin composition according to the present embodiment, the content of the compound (A) represented by Formula (M1) is preferably 5 mass % or higher, more preferably 10 mass % or higher, even more preferably 20 mass % or higher, still more preferably 30 mass % or higher, yet more preferably 35 mass % or higher, and further may be 40 mass % or higher or 45 mass % or higher relative to the total amount of the resin solid content. With the content of the compound (A) being not lower than the above lower limit, the chemical resistance and thermal resistance of the resulting cured product tends to further improve. In addition, the upper limit of the content of the compound (A) represented by Formula (M1) is preferably 95 mass % or lower, more preferably 90 mass % or lower, even more preferably 85 mass % or lower, still more preferably 80 mass % or lower, yet more preferably 75 mass % or lower, and may be 70 mass % or lower, 60 mass % or lower, or 55 mass % or lower of the resin solid content in the resin composition. With the content of the compound (A) being not higher than the above upper limit, the water absorption and thermal resistance of the resulting cured product tends to further improve.

The resin composition according to the present embodiment may contain only one compound (A) represented by Formula (M1) or may contain two or more compounds (A). When the resin composition contains two or more compounds (A), the total amount is preferably in the above range.

Specific Cyanate Ester Compound (B)

The resin composition according to the present embodiment contains the specific cyanate ester compound (B). In the present embodiment, the combined use of the compound (A) represented by Formula (M1) with the specific cyanate ester compound (B) can achieve even better thermal resistance and/or low dielectric properties compared to the combined use of a maleimide compound that has been used in the related art with the specific cyanate ester compound (B).

For the specific cyanate ester compound (B) used in the present embodiment, a cyanate ester compound from a wide variety of cyanate ester compounds containing two or more aromatic moieties per molecule, the aromatic moiety replaced by at least one cyanato group, commonly used in printed wiring boards can be used.

Specifically, the lower limit of the number of the cyanato groups contained in the specific cyanate ester compound (B) used in the present embodiment is preferably 2 or more and more preferably 3 or more. With the number of the cyanato groups contained in the specific cyanate ester compound (B) being not lower than the above lower limit, the thermal resistance of the cured product of the resin composition tends to further improve. The upper limit of the number of the cyanato groups contained in the specific cyanate ester compound (B) is not particularly specified but may be, for example, 50 or less.

In addition, the cured product of the specific cyanate ester compound (B) used in the present embodiment preferably has excellent dielectric properties. For example, the cured product of the specific cyanate ester compound (B) used in the present embodiment has a dielectric constant (Dk) measured according to a cavity resonance perturbation method of preferably 4.0 or lower and more preferably of 3.5 or lower. Furthermore, the lower limit of the dielectric constant is, for example, practically 2.0 or higher. In addition, the cured product of the specific cyanate ester compound (B) used in the present embodiment has a dielectric loss tangent (Df) measured according to a cavity resonance perturbation method of preferably 0.02 or lower and more preferably of 0.015 or lower. Furthermore, the lower limit of the dielectric loss tangent is, for example, practically 0.0001 or higher.

In addition, the cured product of the specific cyanate ester compound (B) used in the present embodiment preferably has high thermal resistance. The cured product of the specific cyanate ester compound (B) used in the present embodiment has a glass transition temperature measured according to the JIS C 6481: 1996 dynamic viscoelasticity measurement of preferably 150° C. or higher, more preferably 180° C. or higher, and even more preferably 200° C. or higher. With the glass transition temperature being not lower than the above lower limit, a cured product with excellent thermal resistance is obtained.

The specific cyanate ester compound (B) has a weight average molecular weight according to a gel permeation chromatography (GPC) calibrated by polystyrene standards of preferably 200 or greater, more preferably of 300 or greater, and even more preferably 400 or greater. With the weight average molecular weight being not less than the above lower limit, the thermal resistance of the cured product of the resin composition tends to further improve. In addition, the weight average molecular weight of the specific cyanate ester compound (B) is preferably 1000 or less, more preferably 900 or less, and even more preferably 800 or less. With the weight molecular weight being not greater than the above upper limit, the moldability and handling properties of the resin composition tend to further improve.

Examples of the specific cyanate ester compound (B) used in the present embodiment include those represented by Formula (B1) below:

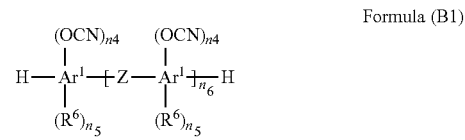

Formula (B1)

where in Formula (B1), each $Ar^1$ independently represents a phenylene group that may have a substituent, a naphthylene group that may have a substituent, or a biphenylene group that may have a substituent; each $R^6$ is independently selected from any one of an alkyl group that has from 1 to 6 carbon atom(s) and may have a substituent, an aryl group that has from 6 to 12 carbon atoms and may have a substituent group, an alkoxy group that has from 1 to 4 carbon atom(s) and may have a substituent, an aralkyl group that may have a substituent in which an alkyl group containing from 1 to 6 carbon atom(s) and an aryl group containing from 6 to 12 carbon atoms are bonded, or an alkylaryl group that may have a substituent in which an alkyl group containing from 1 to 6 carbon atom(s) and an aryl group containing from 6 to 12 carbon atoms are bonded; $n_4$ represents the number of a cyanato group(s) attached to $Ar^1$ and is an integer from 1 to 3; $n_5$ represents the number of $R^6$ attached to $Ar^1$ and is 4—$n_4$ when $Ar^1$ is a phenylene group, 6—$n_4$ when $Ar^1$ is a naphthylene group, and 8—$n_4$ when $Ar^1$ is a biphenylene group; $n_6$ represents the average number of repetitions and is an integer from 0 to 50; the specific cyanate ester compound (B) may be a mixture of compounds differing in $n_5$ and/or $n_6$; and Z is independently selected from any one of a single bond, a divalent organic group containing from 1 to 50 carbon atom(s) (in which a halogen atom may be replaced by a heteroatom), and a divalent organic group containing from 1 to 10 nitrogen atom(s) (such as —N—R—N— and the like).

The substituent in Formula (B1) above is preferably a non-polar group.

The alkyl group of $R^6$ in Formula (B1) may have at least one of a linear structure, a branched structure, or a cyclic structure (such as a cycloalkyl group). In addition, a hydrogen atom in the alkyl group of $R^6$ and the aryl group of $R^6$ in Formula (B1) may be replaced by a halogen atom, such as a fluorine atom or a chlorine atom; an alkoxy group, such as a methoxy group or a phenoxy group; or a cyano group.

Specific examples of the alkyl group include a methyl group, an ethyl group, a propyl group, an isopropyl group, a n-butyl group, an isobutyl group, a tert-butyl group, a n-pentyl group, a 1-ethylpropyl group, a 2,2-dimethylpropyl group, a cyclopentyl group, a hexyl group, a cyclohexyl group, and a trifluoromethyl group.

Specific examples of the aryl group include a phenyl group, a xylyl group, a mesityl groups, a naphthyl group, a phenoxyphenyl group, an ethylphenyl groups, an o-, m-, or p-fluorophenyl group, a dichlorophenyl group, a dicyanophenyl group, a trifluorophenyl group, a methoxyphenyl group, and an o-, m-, or p-tolyl group.

Specific examples of the alkoxy group include a methoxy group, an ethoxy group, a propoxy group, an isopropoxy group, a n-butoxy group, an isobutoxy group, and a tert-butoxy group.

Specific examples of the divalent organic group of Z in Formula (B1) include a methylene group, an ethylene group, a trimethylene group, a cyclopentylene group, a cyclohexylene group, a trimethylcyclohexylene group, a biphenylylmethylene group, a dimethylmethylene-phenylene-dimethylmethylene group, a fluorenediyl group, and a phthalidodiyl group. A hydrogen atom in the divalent organic group may be replaced by a halogen atom, such as a fluorine atom or a chlorine atom; an alkoxy group, such as a methoxy group; an aryloxy group, such as a phenoxy group; or a cyano group. Examples of the divalent organic group containing from 1 to 10 nitrogen atom(s) of Z in Formula (B1) include an imino group and a polyimide group.

In addition, examples of Z in Formula (B1) include structures represented by Formula (B2) or Formula (B3) below.

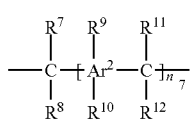

Formula (B2)

In Formula (B2), $Ar^2$ is selected from any one of a phenylene group, a naphthylene group, and a biphenylene group; $R^7$, $R^8$, $R^{11}$, and $R^{12}$ are each independently selected from any one of a hydrogen atom, an alkyl group containing from 1 to 6 carbon atom(s), an aryl group containing from 6 to 12 carbon atoms, and an aryl group replaced by at least one of a trifluoromethyl group or a phenolic hydroxyl group; $R^9$ and $R^{10}$ are each independently selected from a hydrogen atom, an alkyl group containing from 1 to 6 carbon atom(s), an aryl group containing from 6 to 12 carbon atoms, an alkoxy group containing from 1 to 4 carbon atom(s), and a hydroxy group; and $n_7$ represents an integer from 0 to 5, but the specific cyanate ester compound (B) may be a mixture of compounds containing a group represented by Formula (B2) differing in $n_7$.

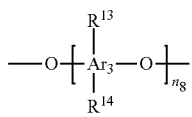

Formula (B3)

In Formula (B3), $Ar^3$ is selected from any one of a phenylene group, a naphthylene group, and a biphenylene group; $R^{13}$ and $R^{14}$ are each independently selected from any one of a hydrogen atom, an alkyl group containing from 1 to 6 carbon atom(s), an aryl group containing from 6 to 12 carbon atoms, a benzyl group, an alkoxy group containing from 1 to 4 carbon atom(s), and an aryl group replaced by at least one of a hydroxy group, a trifluoromethyl group, or a cyanato group; and $n_8$ represents an integer from 0 to 5, but the specific cyanate ester compound (B) may be a mixture of compounds containing a group represented by Formula (83) differing in $n_8$.

Furthermore, examples of Z in Formula (B1) include divalent groups represented by formulas below:

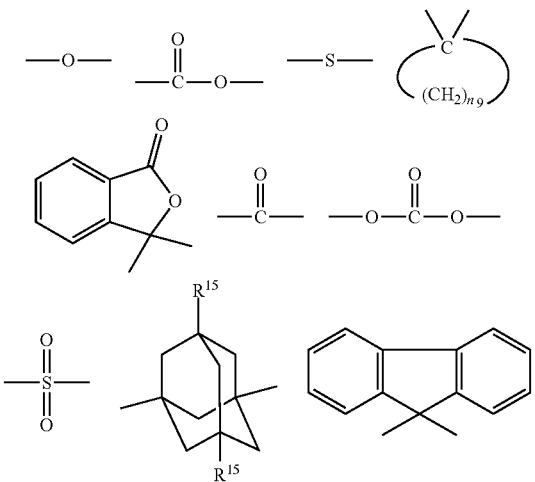

where $n_9$ represents an integer from 4 to 7; and each $R^{15}$ independently represents a hydrogen atom or an alkyl group containing from 1 to 6 carbon atom(s).

Specific examples of $Ar^2$ in Formula (B2) and $Ar^3$ in Formula (B3) include a 1,4-phenylene group, a 1,3-phenylene group, a 4,4'-biphenylene groups, a 2,4'-biphenylene group, a 2,2'-biphenylene group, a 2,3'-biphenylene group, a 3,3'-biphenylene group, a 3,4'-biphenylene group, a 2,6-naphthylene group, a 1,5-naphthylene group, a 1,6-naphthylene group, a 1,8-naphthylene group, a 1,3-naphthylene group, and a 1,4-naphthylene group. The alkyl groups and aryl groups of $R^7$ to $R^{12}$ in Formula (B2) and $R^{13}$ and $R^{14}$ in Formula (B3) are the same as those described for Formula (B1).

Examples of the specific cyanate ester compound (B) include phenol novolac-type cyanate ester compounds, naphthol aralkyl-type cyanate ester compounds, biphenyl aralkyl-type cyanate ester compounds, naphthylene ether-type cyanate ester compounds, xylene resin-type cyanate ester compounds, adamantane skeleton-type cyanate ester compounds, bisphenol A-type cyanate ester compounds, bisphenol M-type cyanate ester compounds, and diallyl bisphenol A-type cyanate ester compounds.

Specific examples of the specific cyanate ester compound (B) include, but are not particularly limited to, 1,2-dicyanatobenzene, 1,3-dicyanatobenzene, 1,4-dicyanatobenzene, 1,4-dicyanato-2-tert-butylbenzene, 1,4-dicyanato-2,4-dimethylbenzene, 1,4-dicyanato-2,3,4-trimethylbenzene, 1,3-dicyanato-2,4,6-trimethylbenzene, 1,3-dicyanato-5-methylbenzene, 2,2'-dicyanato-1,1'-binaphthyl, 1,3-,1,4-,1,5-,1,6-,1,7-,2,3-,2,6-, or 2,7-dicyanatonaphthalene, 2,2'- or 4,4'-dicyanatobiphenyl, 4,4'-dicyanatooctafluorobiphenyl, 2,4'- or 4,4'-dicyanatodiphenylmethane, bis(4-cyanato-3,5-dimethylphenyl)methane, 1,1-bis(4-cyanatophenyl)ethane, 1,1-bis(4-cyanatophenyl)propane, 2,2-bis(4-cyanatophenyl)propane, 2,2-bis(3-allyl-4-cyanatophenyl)propane, 2,2-bis(4-cyanato-3-methylphenyl)propane, 2,2-bis(2-cyanato-5-biphenylyl)propane, 2,2-bis(4-cyanatophenyl) hexafluoropropane, 2,2-bis(4-cyanato-3,5-dimethylphenyl) propane, 1,1-bis(4-cyanatophenyl)butane, 1,1-bis(4-cyanatophenyl)isobutane, 1,1-bis(4-cyanatophenyl)pentane, 1,1-bis(4-cyanatophenyl)-3-methylbutane, 1,1-bis(4-cyanatophenyl)-2-methylbutane, 1,1-bis(4-cyanatophenyl)-2,2-dimethylpropane, 2,2-bis(4-cyanatophenyl)butane, 2,2-bis(4-cyanatophenyl)pentane, 2,2-bis(4-cyanatophenyl) hexane, 2,2-bis(4-cyanatophenyl)-3-methylbutane, 2,2-bis (4-cyanatophenyl)-4-methylpentane, 2,2-bis(4-cyanatophenyl)-3,3-dimethylbutane, 3,3-bis(4-cyanatophenyl)hexane, 3,3-bis(4-cyanatophenyl)heptane, 3,3-bis(4-cyanatophenyl)octane, 3,3-bis(4-cyanatophenyl)-2-methylpentane, 3,3-bis(4-cyanatophenyl)-2-methylhexane, 3,3-bis(4-cyanatophenyl)-2,2-dimethylpentane, 4,4-bis(4-cyanatophenyl)-3-methylheptane, 3,3-bis(4-cyanatophenyl)-2-methylheptane, 3,3-bis(4-cyanatophenyl)-2,2-dimethylhexane, 3,3-bis(4-cyanatophenyl)-2,4-dimethylhexane, 3,3-bis(4-cyanatophenyl)-2,2,4-trimethylpentane, 2,2-bis(4-cyanatophenyl)-1,1,1,3,3,3-hexafluoropropane, bis(4-cyanatophenyl)phenylmethane, 1,1-bis(4-cyanatophenyl)-1-phenylethane, bis(4-cyanatophenyl)biphenylmethane, 1,1-bis(4-cyanatophenyl)cyclopentane, 1,1-bis(4-cyanatophenyl)cyclohexane, 2,2-bis(4-cyanato-3-isopropylphenyl)propane, 1,1-bis(3-cyclohexyl-4-cyanatophenyl)cyclohexane, bis(4-cyanatophenyl) diphenylmethane, bis(4-cyanatophenyl)-2,2-dichloroethylene, 1,3-bis[2-(4-cyanatophenyl)-2-propyl]benzene, 1,4-bis[2-(4-cyanatophenyl)-2-propyl]benzene, 1,1-bis(4-cyanatophenyl)-3,3,5-trimethylcyclohexane, 4-[bis(4-cyanatophenyl)methyl]biphenyl, 4,4-dicyanatobenzophenone, 1,3-bis(4-cyanatophenyl)-2-propen-1-one, bis(4-cyanatophenyl) ether, bis(4-cyanatophenyl) sulfide, bis(4-cyanatophenyl) sulfone, 4-cyanatobenzoate-4-cyanatophenyl ester (4-cyanatophenyl-4-cyanatobenzoate), bis-(4-cyanatophenyl) carbonate, 1,3-bis(4-cyanatophenyl)adamantane, 1,3-bis(4-cyanatophenyl)-5,7-dimethyladamantane, 3,3-bis(4-cyanatophenyl)isobenzofuran-1(3H)-one (cyanate of phenolphthalein), 3,3-bis(4-cyanato-3-methylphenyl)isobenzofuran-1(3H)-one (cyanate of o-cresolphthalein), 9,9-bis(4-cyanatophenyl)fluorene, 9,9-bis(4-cyanato-3-methylphenyl)fluorene, 9,9-bis(2-cyanato-5-biphenylyl)fluorene, tris(4-cyanatophenyl)methane, 1,1,1-tris(4-cyanatophenyl)ethane, 1,1,3-tris(4-cyanatophenyl)propane, α,α,α'-tris(4-cyanatophenyl)-1-ethyl-4-isopropylbenzene, 1,1,2,2-tetrakis(4-cyanatophenyl)ethane, tetrakis(4-cyanatophenyl)methane, 2,4,6-tris(N-methyl-4-cyanatoanilino)-1,3,5-triazine, 2,4-bis(N-methyl-4-cyanatoanilino)-6-(N-methylanilino)-1,3,5-triazine, bis(N-4-cyanato-2-methylphenyl)-4,4'-oxydiphthalimide, bis(N-3-cyanato-4-methylphenyl)-4,4'-oxydiphthalimide, bis(N-4-cyanatophenyl)-4,4'-oxydiphthalimide, bis(N-4-cyanato-2-methylphenyl)-4,4'-(hexafluoroisopropylidene)diphthalimide, tris(3,5-dimethyl-4-cyanatobenzyl)isocyanurate, 2-phenyl-3,3-bis(4-cyanatophenyl)phthalimidine, 2-(4-methylphenyl)-3,3-bis(4-cyanatophenyl)phthalimidine, 2-phenyl-3,3-bis(4-cyanato-3-methylphenyl)phthalimidine, 1-methyl-3,3-bis(4-cyanatophenyl)indoline-2-one, 2-phenyl-3,3-bis(4-cyanatophenyl)indoline-2-one, phenol novolac resins and cresol novolac resins (those formed by reacting phenol, an alkyl-substituted phenol, or a halogen-substituted phenol with a formaldehyde compound, such as formalin or paraformaldehyde, in an acidic solution by a known method), trisphenol novolac resins (those formed by reacting hydroxybenzaldehyde with phenol in the presence of an acid catalysis), fluorene novolac resins (those formed by reacting a fluorenone compound with a 9,9-bis(hydroxyaryl)fluorene in the presence of an acidic catalyst), phenol aralkyl resins, cresol aralkyl resins, naphthol aralkyl resins, and biphenyl aralkyl resins (those formed by reacting a bishalogenomethyl compound, such as those represented by $Ar^4$—$(CH_2Z')_2$ ($Ar^4$ is a phenylene group, a naphthylene group, or a biphenylene group, and these may have a substitute) with a phenolic compound in the presence of an acidic catalyst or in the absence of a catalyst by a known method, those formed by reacting a bis(alkoxymethyl) compound, such as those represented by $Ar^4$—$(CH_2OR)_2$, or a bis(hydroxymethyl) compound, such as those represented by $Ar^4$—$(CH_2OH)_2$, with a phenolic compound in the presence of an acidic catalyst, or those formed by polymerization of an aromatic aldehyde compound, an aralkyl compound, and a phenolic compound), phenol-modified xylene formaldehyde resins (those formed by reacting a xylene formaldehyde resin with a phenolic compound in the presence of an acidic catalyst by a known method), modified naphthalene formaldehyde resins (those formed by reacting a naphthalene formaldehyde resin with a hydroxy-substituted aromatic compound in the presence of an acidic catalyst by a known method), and those formed by cyanate esterification of a phenolic resin, such as a phenol-modified dicyclopentadiene resin or a phenolic resin having a poly(naphthylene ether) structure (those formed by dehydrogenation condensation of a polyhydric hydroxynaphthalene compound containing two or more phenolic hydroxyl groups per molecule in the presence of a basic catalyst by a known method) by a similar method described above. A cyanate ester compound of these may be used alone, or two or more may be used in combination.

Among these, the specific cyanate ester compound (B) is preferably a phenol novolac-type cyanate ester compound, a naphthol aralkyl-type cyanate ester compound, a naphthylene ether-type cyanate ester compound, a bisphenol A-type cyanate ester compound, a bisphenol M-type cyanate ester compound, and a diallyl bisphenol-type cyanate ester compound, more preferably a naphthol aralkyl-type cyanate ester compound and a bisphenol A-type cyanate ester compound, and a naphthol aralkyl-type cyanate ester compound is particularly preferred because of excellent moldability, low water absorption, and chemical resistance of the resulting cured product in addition to the thermal resistance and low dielectric properties of the cured product.

In particular, combining a naphthol aralkyl-type cyanate ester with the compound represented by Formula (M1) effectively improve the chemical resistance and desmear resistance. This is presumed to be a result of a synergistic effect of the naphthol aralkyl-type cyanate ester compound and the compound represented by Formula (M1); that is, the naphthol aralkyl-type cyanate ester compound has relatively high proportion of the aromatic ring in the molecule and thus is inherently hard to break, and the compound represented by Formula (M1) has the alicyclic structure and thus is less likely to absorb moisture.

In the resin composition according to the present embodiment, the content of the specific cyanate ester compound (B) is preferably from 1 to 90 parts by mass when a resin solid content in the resin composition is 100 parts by mass. The lower limit of the content of the specific cyanate ester compound (B) is preferably 5 parts by mass or greater, more preferably 10 parts by mass or greater, even more preferably 15 parts by mass or greater, still more preferably 20 parts by mass or greater, yet more preferably 25 parts by mass or greater, and may be 30 parts by mass or greater, 40 parts by mass or greater, or 45 parts by mass or greater when the resin solid content in the resin composition is 100 parts by mass. With the content of the specific cyanate ester compound (B) being not lower than the above lower limit, the thermal resistance and low water absorption of the resulting cured product tends to further improve. In addition, the upper limit of the content of the specific cyanate ester compound (B) is preferably 90 parts by mass or less, more preferably 80 parts by mass or less, even more preferably 70 parts by mass or less, still more preferably 65 parts by mass or less, and yet more preferably 60 parts by mass or less when the resin solid content in the resin composition is 100 parts. With the content of the specific cyanate ester compound (B) being not more than the above upper limit, the dielectric properties (low dielectric properties) and low water absorption of the resulting cured product tend to further improve.

In addition, in the resin composition according to the present embodiment, the content of the specific cyanate ester compound (B) is preferably 5 mass % or higher, more preferably 10 mass % or higher, even more preferably 15 mass % or higher, still more preferably 20 mass % or higher, yet more preferably 25 mass % or higher, and may be 30 mass %, 40 mass % or higher, or 45 mass % or higher of the resin solid content. With the content of the specific cyanate ester compound (B) being not lower than the lower limit, the thermal resistance and low water absorption of the resulting cured product tend to further improve. Furthermore, the upper limit of the content of the specific cyanate ester compound (B) is preferably 90 mass % or lower, more preferably 80 mass % or lower, even more preferably 70 mass % or lower, still more preferably 65 mass % or lower, and yet more preferably 60 mass % or lower of the resin solid content in the resin composition. With the content of the specific cyanate ester compound (B) being not higher than the above upper limit, the dielectric properties (low dielectric properties) and low water absorption of the resulting cured product tend to further improve.

The resin composition according to the present embodiment may contain only one specific cyanate ester compound (B) or may contain two or more specific cyanate ester compounds (B). When the resin composition contains two or more specific cyanate ester compounds (B), the total amount is preferably in the above range.

In the resin composition according to the present embodiment, the total amount of the compound (A) represented by Formula (M1) and the specific cyanate ester compound (B) is preferably 20 mass % or higher, more preferably 30 mass % or higher, even more preferably 40 mass % or higher, still more preferably 50 mass % or higher, yet more preferably 60 mass % or higher, still even more preferably 70 mass % or higher, and may be 80 mass % or higher, 90 mass % or higher, or 95 mass % or higher of the resin solid content. With the total amount being not lower than the above lower limit, the thermal resistance and/or low dielectric properties of the resulting cured product tend to further improve. In addition, the upper limit of the total amount is preferably 100 mass % of the resin solid content in the resin composition.

In the resin composition according to the present embodiment, the mass ratio of the compound (A) represented by Formula (M1) and the specific cyanate ester compound (B) is preferably from 9:1 to 1:9, more preferably from 5:1 to 1:5, and even more preferably from 3:1 to 1:3. With such a blend ratio, the fused rings of the alicyclic ring and the aromatic ring, such as the indan ring, contained in the compound (A) represented by Formula (M1) are present at appropriate distances in the cured product, and this can effectively achieve the high thermal resistance and low water absorption.

Other Resin Solid Content (C)

The resin composition according to the present embodiment may further contain at least one kind of other resin component (C) selected from the group consisting of a maleimide compound other than the compound (A) represented by Formula (M1), an epoxy compound, a phenolic compound, an oxetane resin, a benzoxazine compound, and a compound containing a polymerizable unsaturated group. The resin composition containing such a component can more effectively achieve other desired performance required for a printed wiring board.

Preferably, cured products of the other resin components (C) each have excellent dielectric properties. For example, the cured products of the other resin components (C) should each have a dielectric constant (Dk) measured according to a cavity resonance perturbation method of preferably 4.0 or lower and more preferably 3.5 or lower. In addition, the lower limit of the dielectric constant (Dk) is, for example, practically 2.0 or higher. Furthermore, each cured product of the other resin component (C) has a dielectric loss tangent (Df) measured according to a cavity resonance perturbation method of preferably 0.01 or lower and more preferably of 0.007 or lower. In addition, the lower limit of the dielectric loss tangent (Df) is, for example, practically 0.0001 or higher.

Furthermore, the cured products of the other resin components (C) preferably have high thermal resistance. For example, the cured products of the other resin components (C) each have a glass transition temperature measured in accordance with the JIS C 6481 dynamic viscoelasticity measurement of preferably 150° C. or higher, more preferably 180° C. or higher, and even more preferably 200° C. or higher. With the glass transition temperature being not lower than the above lower limit, a cured product with even better thermal resistance is obtained. In addition, the upper limit of the glass transition temperature is practically 400° C. or lower.

Furthermore, the resin composition according to the present embodiment may contain an elastomer. Moreover, the resin composition according to the present embodiment may contain a silane coupling agent. Still more, the resin composition according to the present embodiment may contain an active ester compound. In addition, the resin composition may contain an additive commonly used in the technical field of the present invention without departing from the spirit of the present invention.

Hereinafter, details of the other resin component (C), as well as the elastomer, silane coupling agent, and active ester will be described.

Maleimide Compound Other than Compound (A) Represented by Formula (M1)

The resin composition according to the present embodiment may contain a maleimide compound (which may be hereinafter referred to simply as the "other maleimide compound") other than the compound (A) represented by Formula (M1).

The other maleimide compound is any compound containing one or more (preferably from 2 to 12, more preferably from 2 to 6, even more preferably from 2 to 4, still more preferably 2 or 3, and yet more preferably 2) maleimide groups per molecule and is not particularly limited, and a compound from a wide variety of compounds commonly used in the field of printed wiring boards can be used.

An example of the other maleimide compound includes compounds represented by Formulas (2M) to (4M). Using such other maleimide compound in a printed wiring board material (e.g., such as a laminate or a metal-foil clad laminate) or the like can impart excellent thermal resistance to the material.

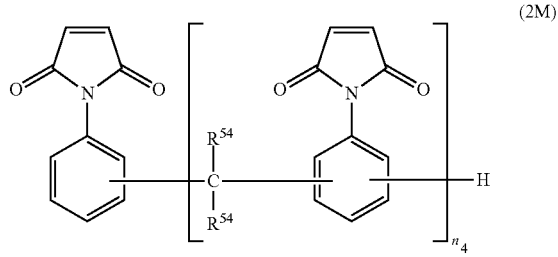

(2M)

In Formula (2M), $R^{54}$ each independently represents a hydrogen atom or a methyl group; and $n_4$ represents an integer of 1 or greater. $n_4$ is preferably an integer from 1 to 10, more preferably an integer from 1 to 5, even more preferably an integer from 1 to 3, and still more preferably 1 or 2.

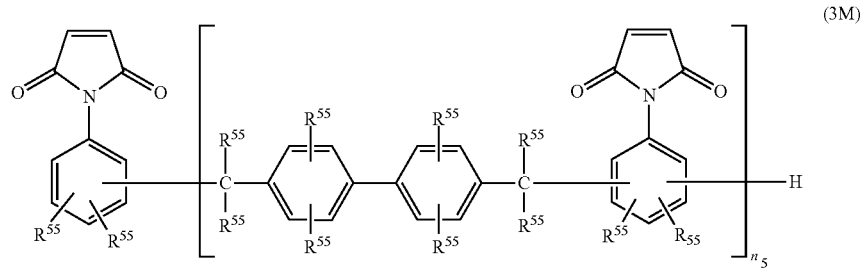

(3M)

In Formula (3M), $R^{55}$ each independently represents a hydrogen atom, an alkyl group containing from 1 to 8 carbon atom(s), or a phenyl group; and $n_5$ represents an integer of 1 or greater and 10 or less.

$R^{55}$ is preferably a hydrogen atom, a methyl group, an ethyl group, a n-propyl group, an isopropyl group, a n-butyl group, an isobutyl group, a t-butyl group, a n-pentyl group, or a phenyl group, more preferably one of a hydrogen atom and a methyl group, and even more preferably a hydrogen atom.

$n_5$ is preferably an integer from 1 to 5, more preferably an integer from 1 to 3, and even more preferably 1 or 2.

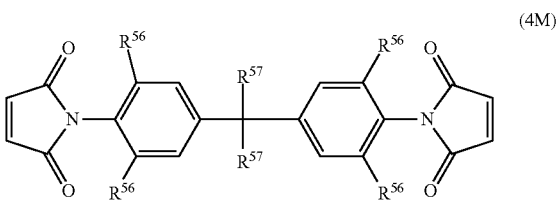

(4M)

In Formula (4M), $R^{56}$ each independently represents a hydrogen atom, a methyl group, or an ethyl group; and each $R^{57}$ independently represents a hydrogen atom or a methyl group.

Among the compounds represented by Formula (2M) to Formula (4M) above, the other maleimide compound is more preferably a compound represented by Formula (3M).

The other maleimide compound may be prepared by a known method, or a commercially available product may be used. For the commercially available product, examples of the compound represented by Formula (3M) include "MIR-3000" available from Nippon Kayaku Co., Ltd., examples of the compound represented by Formula (2M) include "BMI-2300" available from Daiwa Kasei Industry Co., Ltd., and examples of the compound represented by Formula (4M) include "BM1-70" available from K-I Chemical Industry Co., Ltd.

In addition, examples of the other maleimide compound other than those described above include oligomers of phenylmethane maleimide, m-phenylene bismaleimide, 2,2-bis(4-(4-maleimidophenoxy)-phenyl)propane, 4-methyl-1,3-phenylene bismaleimide, 1,6-bismaleimide-(2,2,4-trimethyl)hexane, 4,4'-diphenylether bismaleimide, 4,4'-diphenylsulfone bismaleimide, 1,3-bis(3-maleimidophenoxy)benzene, 1,3-bis(4-maleimidophenoxy) benzene, and prepolymers of these, and prepolymers of a maleimide of these and an amine.

When the resin composition according to the present embodiment contains the other maleimide compound, the lower limit of the content of the other maleimide compound is preferably 1 part by mass or greater, more preferably 10 parts by mass or greater, and may be 15 parts by mass or greater per 100 parts by mass of the resin solid content in the resin composition. With the content of the other maleimide compound being 1 part by mass or greater, flame resistance of the resulting cured product tends to improve. When the resin composition according to the present embodiment contains the other maleimide compound, the upper limit of the content of the other maleimide compound is preferably 70 parts by mass or less, more preferably 50 parts by mass or less, even more preferably 30 parts by mass or less, and still more preferably 20 parts by mass or less per 100 parts by mass of the resin solid content in the resin composition. With the content of the other maleimide compound being 70 parts by mass or less, the metal foil peel strength and low water absorption tend to improve.

The resin composition in the present embodiment may contain only one other maleimide compound or may contain two or more other maleimide compounds. When the resin composition contains two or more other maleimide compounds, the total amount is preferably in the above range.

In addition, the resin composition in the present embodiment can also be configured to contain substantially no other maleimide compound. "To contain substantially no" means that the content of the other maleimide compound is less than 1 part by mass per 100 parts by mass of the resin solid content in the resin composition.

Epoxy Compound

The resin composition according to the present embodiment may contain an epoxy compound.

The epoxy compound is any compound or resin containing one or more (preferably from 2 to 12, more preferably from 2 to 6, even more preferably from 2 to 4, still more preferably 2 or 3, and yet more preferably 2) epoxy groups per molecule and is not particularly limited, and a compound from a wide variety of compounds commonly used in the field of printed wiring boards can be used.

Examples of the epoxy compound include compounds obtained by epoxidation of a double bond, such as bisphenol A-type epoxy resins, bisphenol E-type epoxy resins, bisphenol F-type epoxy resins, bisphenol S-type epoxy resins, phenol novolac-type epoxy resins, bisphenol A novolac-type epoxy resins, glycidyl ester-type epoxy resins, aralkyl novolac-type epoxy resins, biphenyl aralkyl-type epoxy resins, naphthylene ether-type epoxy resins, cresol novolac-type epoxy resins, multifunctional phenol-type epoxy resins, naphthalene-type epoxy resins, anthracene-type epoxy resins, naphthalene skeleton-modified novolac-type epoxy resins, phenol aralkyl-type epoxy resins, naphthol aralkyl-type epoxy resins, dicyclopentadiene-type epoxy resins, biphenyl-type epoxy resins, alicyclic epoxy resins, polyol-type epoxy resins, phosphorus-containing epoxy resins, glycidyl amine, glycidyl ester, and butadiene; and compounds obtained by reaction of a hydroxyl group-containing silicone resin with epichlorohydrin. Using such a compound improves the moldability and adhesion of the resin composition. Among these, from the viewpoints of further improving the flame retardancy and thermal resistance, the epoxy compound is preferably a biphenyl aralkyl-type epoxy resin, a naphthylene ether-type epoxy resin, a multifunctional phenol-type epoxy resin, or a naphthalene-type epoxy resin, and more preferably a biphenyl aralkyl-type epoxy resin.

The resin composition according to the present embodiment preferably contains the epoxy resin within a range that does not impair the effects of the present invention. When the resin composition according to the present embodiment contains the epoxy compound, the content of the epoxy compound is preferably 0.1 parts by mass or greater, more preferably 1 part by mass or greater, and even more preferably 2 parts by mass or greater per 100 parts by mass of the resin solid content in the resin composition. With the content of the epoxy resin being 0.1 parts by mass or greater, the metal foil peel strength and toughness tend to improve. When the resin composition according to the present embodiment contains the epoxy resin, the upper limit of the content of the epoxy resin is preferably 50 parts by mass or less, more preferably 30 parts by mass or less, even more preferably 20 parts by mass or less, still more preferably 10 parts by mass, yet more preferably 8 parts by mass or less, and still even more preferably 5 parts by mass or less per 100 parts by mass of the resin solid content in the resin composition. With the content of the epoxy resin being 50 parts by mass or less, electrical properties of the resulting cured product tend to improve.

The resin composition in the present embodiment may contain only one epoxy compound or may contain two or more epoxy compounds. When the resin composition contains two or more epoxy compounds, the total amount is preferably in the above range.

In addition, the resin composition in the present embodiment can also be configured to contain substantially no epoxy compound. "To contain substantially no" means that the content of the epoxy compound is less than 1 part by mass per 100 parts by mass of the resin solid content in the resin composition.
Phenolic Compound The resin composition according to the present embodiment may contain a phenolic compound.

The phenolic compound is any phenolic compound containing one or more (preferably from 2 to 12, more preferably from 2 to 6, even more preferably from 2 to 4, still more preferably 2 or 3, and yet more preferably 2) phenolic hydroxyl groups per molecule and is not particularly limited, and a compound from a wide variety of compounds commonly used in the field of printed wiring boards can be used.

Examples of the phenolic compound include bisphenol A-type phenolic resins, bisphenol E-type phenolic resins, bisphenol F-type phenolic resins, bisphenol S-type phenolic resins, phenol novolac resins, bisphenol A novolac-type phenolic resins, glycidyl ester-type phenolic resins, aralkyl novolac phenolic resins, biphenyl aralkyl-type phenolic resins, cresol novolac-type phenolic resins, multifunctional phenolic resins, naphthol resins, naphthol novolac resins, multifunctional naphthol resins, anthracene-type phenolic resins, naphthalene skeleton-modified novolac-type phenolic resins, phenol aralkyl-type phenolic resins, naphthol aralkyl-type phenolic resins, dicyclopentadiene-type phenolic resins, biphenyl-type phenolic resins, alicyclic phenolic resins, polyol-type phenolic resins, phosphorus-containing phenolic resins, and hydroxyl group-containing silicone resins. Among these, from the viewpoint of further improving the flame resistance of the resulting cured product, the phenolic compound is preferably at least one selected from the group consisting of biphenyl aralkyl-type phenolic resins, naphthol aralkyl-type phenolic resins, phosphorus-containing phenolic resins, and hydroxyl group-containing silicone resins.

The resin composition according to the present embodiment preferably contains the phenolic compound within a range that does not impair the effects of the present invention. When the resin composition according to the present embodiment contains the phenolic compound, the content of the phenolic compound is preferably 0.1 parts by mass or greater and preferably 50 parts by mass or less per 100 parts by mass of the resin solid content in the resin composition.

The resin composition in the present embodiment may contain only one phenolic compound or may contain two or more phenolic compounds. When the resin composition contains two or more phenolic compounds, the total amount is preferably in the above range.

In addition, the resin composition in the present embodiment can also be configured to contain substantially no phenolic compound. "To contain substantially no" means that the content of the phenolic compound is less than 0.1 parts by mass per 100 parts by mass of the resin solid content in the resin composition.
Oxetane Resin The resin composition according to the present embodiment may contain an oxetane resin.

The oxetane resin is any compound containing one or more (preferably from 2 to 12, more preferably from 2 to 6, even more preferably from 2 to 4, still more preferably 2 or 3, and yet more preferably 2) oxetanyl groups and is not particularly limited, and a compound from a wide variety of compounds commonly used in the field of printed wiring boards can be used.

Examples of the oxetane resin include oxetane, alkyl oxetanes (e.g., such as 2-methyloxetane, 2,2-dimethyloxetane, 3-methyloxetane, and 3,3-dimethyloxatane), 3-methyl-3-methoxymethyloxetane, 3,3-di(trifluoromethyl)oxetane, 2-chloromethyloxetane, 3,3-bis(chloromethyl)oxetane, biphenyl-type oxetane, OXT-101 (available from Toagosei Co., Ltd.), and OXT-121 (available from Toagosei Co., Ltd.).

The resin composition according to the present embodiment preferably contains the oxetane resin within a range that does not impair the effects of the present invention.

When the resin composition according to the present embodiment contains the oxetane resin, the content of the oxetane resin is preferably 0.1 parts by mass or greater, more preferably 1 part by mass or greater, and even more preferably 2 parts by mass or greater per 100 parts by mass of the resin solid content in the resin composition. With the content of the oxetane resin being 0.1 parts by mass or greater, the metal foil peel strength and toughness tend to improve. When the resin composition according to the present embodiment contains the oxetane resin, the upper limit of the content of the oxetane resin is preferably 50 parts by mass or less, more preferably 30 parts by mass or less, even more preferably 20 parts by mass or less, still more preferably 10 parts by mass or less, and yet more preferably 8 parts by mass or less per 100 parts by mass of the resin solid content in the resin composition. With the content of the oxetane resin being 50 parts by mass or less, the electrical properties of the resulting cured product tend to improve.

The resin composition in the present embodiment may contain only one oxetane resin or may contain two or more oxetane resins. When the resin composition contains two or more oxetane resins, the total amount is preferably in the above range.

In addition, the resin composition in the present embodiment can also be configured to contain substantially no oxetane resin. "To contain substantially no" means that the content of the oxetane resin is less than 0.1 parts by mass per 100 parts by mass of the resin solid content in the resin composition.

Benzoxazine Compound

The resin composition according to the present embodiment may contain a benzoxazine compound.

The benzoxazine compound is any compound containing two or more (preferably from 2 to 12, more preferably from 2 to 6, even more preferably from 2 to 4, still more preferably 2 or 3, and yet more preferably 2) dihydrobenzoxazine rings per molecule and is not particularly limited, and a compound from a wide variety of compounds commonly used in the field of printed wiring boards can be used.

Examples of the benzoxazine compound include a bisphenol A-type benzoxazine BA-BXZ (available from Konishi Chemical Ind. Co., Ltd.), a bisphenol F-type benzoxazine BF-BXZ (available from Konishi Chemical Industry Co., Ltd.), and a bisphenol S-type benzoxazine BS-BXZ (available from Konishi Chemical Industry Co., Ltd.).

The resin composition of the present embodiment preferably contains the benzoxazine compound within a range that does not impair the effects of the present invention. When the resin composition of the present embodiment contains the benzoxazine compound, the content of the benzoxazine compound is preferably 0.1 parts by mass or greater and preferably 50 parts by mass or less per 100 parts by mass of the resin solid content in the resin composition.

The resin composition in the present embodiment may contain only one benzoxazine compound or may contain two or more benzoxazine compounds. When the resin composition contains two or more benzoxazine compounds, the total amount is preferably in the above range.

In addition, the resin composition in the present embodiment can also be configured to contain substantially no benzoxazine compound. "To contain substantially no" means that the content of the benzoxazine compound is less than 0.1 parts by mass per 100 parts by mass of the resin solid content in the resin composition.

Compound Containing Polymerizable Unsaturated Group

The resin composition according to the present embodiment may contain a compound containing a polymerizable unsaturated group. The number of unsaturated groups contained in the compound is one or more per molecule, preferably from 2 to 12, more preferably from 2 to 6, even more preferably from 2 to 4, still more preferably 2 or 3, and yet more preferably 2.

The compound containing a polymerizable unsaturated group is not particularly limited, and a compound from a wide variety of compounds commonly used in the field of printed wiring boards can be used.

Specific examples of the compound containing a polymerizable unsaturated group include poly(phenylene ether) compound containing two or more carbon-carbon unsaturated double bonds, vinyl compounds (e.g., such as ethylene, propylene, styrene, divinylbenzene, and divinylbiphenyl), acrylates (e.g., such as methyl (meth)acrylate), (meth)acrylates of mono- or polyalcohols (e.g., such as 2-hydroxypropyl (meth)acrylate, polypropylene glycol di(meth)acrylate, trimethylolpropane di(meth)acrylate, trimethylolpropane tri(meth)acrylate, pentaerythritol tetra(meth)acrylate, and dipentaerythritol hexa(meth)acrylate), epoxy (meth)acrylates (e.g., such as bisphenol A-type epoxy (meth)acrylate and bisphenol F-type epoxy (meth)acrylate), and benzocyclobutene resins.

Details of the poly(phenylene ether) compound containing two or more carbon-carbon unsaturated double bonds can be considered with reference to paragraphs [0026] to [0041] described in WO 2019/230661, the contents of which are incorporated in the present specification.

The resin composition according to the present embodiment preferably contains the compound containing a polymerizable unsaturated group within a range that does not impair the effects of the present invention. When the resin composition according to the present embodiment contains the compound containing a polymerizable unsaturated group, the content of the compound containing a polymerizable unsaturated group is preferably 0.1 parts by mass or greater and preferably 50 parts by mass or less per 100 parts by mass of the resin solid content in the resin composition.

The resin composition in the present embodiment may include only one type, or two ore more type of the compound containing a polymerizable unsaturated group. When the resin composition contains two or more compounds containing a polymerizable unsaturated group, the total amount is preferably in the above range.

In addition, the resin composition in the present embodiment may have a configuration that is substantially free from a polymerizable unsaturated group. "To contain substantially no" means that the content of the compound containing a polymerizable unsaturated group is less than 0.1 parts by mass per 100 parts by mass of the resin solid content in the resin composition.

Elastomer

The resin composition according to the present embodiment may contain an elastomer.

In the present embodiment, the elastomer is not particularly limited, and examples include at least one selected from the group consisting of polyisoprene, polybutadiene, styrene-butadiene, butyl rubber, ethylene-propylene rubber, styrene-butadiene-ethylene, styrene-butadiene-styrene, styrene-isoprene-styrene, styrene-ethylene-butylene-styrene, styrene-propylene-styrene, styrene-ethylene-propylene-styrene, fluororubber, silicone rubber, their hydrogenated compounds, their alkyl compounds, and their copolymers. Among these, from the viewpoint of excellent electrical properties, the elastomer is preferably at least one selected from the group consisting of styrene-butadiene, styrene-butadiene ethylene, styrene-butadiene-styrene, styrene-isoprene-styrene, styrene-ethylene-butylene-styrene, styrene-propylene-styrene, styrene-ethylene-propylene-styrene, their hydrogenated compounds, their alkyl compounds, and their copolymers, and from the viewpoint of even better compatibility with the specific cyanate ester compound (B), the elastomer is more preferably at least one selected from the group consisting of styrene-butadiene rubber, butadiene rubber, and isoprene rubber.

In the present embodiment, from the viewpoint of excellent electrical properties, the elastomer preferably has an SP value of 9 $(cal/cm^3)^{1/2}$ or lower. The SP value is referred to as a dissolution parameter and is calculated from the square root of the heat of evaporation required to evaporate 1 $cm^3$ of liquid $(cal/cm^3)^{1/2}$. In general, a smaller SP value is considered to indicate a lower polarity, and two components with closer SP values are considered to have higher affinity. The elastomer with an SP value of 9 $(cal/cm^3)^{1/2}$ or lower provides more suitable electrical properties to the resin composition used in a printed wiring board for high frequency applications.

In the present embodiment, the elastomer with a weight average molecular weight of 80000 or greater according to a GPC method calibrated by polystyrene standards and solid at 25° C. further improves crack resistance when used in a material for a printed wiring board (e.g., a laminated or a metal-foil clad laminate); thus, this is preferred. On the other hand, the elastomer with a weight average molecular weight of 40000 or less according to a GPC method calibrated by polystyrene standards and liquid at 25° C. reduces the warpage when a film coated with the elastomer is attached to a substrate, and thus the film is particularly suitable as a build-up material for a printed wiring board.

The resin composition according to the present embodiment preferably contains the elastomer within a range that does not impair the effects of the present invention. When the resin composition according to the present embodiment contains the elastomer, the content of the elastomer is preferably 0.1 parts by mass or greater, more preferably 1 part by mass or greater, and even more preferably 2 parts by mass or greater per 100 parts by mass of the resin solid content in the resin composition. When the resin composition according to the present embodiment contains the elastomer, the upper limit of the content of the elastomer is preferably 50 parts by mass or less, more preferably 30 parts by mass or less, even more preferably 20 parts by mass or less, still more preferably 10 parts by mass or less, and yet more preferably 8 parts by mass or less per 100 parts by mass of the resin solid content in the resin composition.

The resin composition in the present embodiment may contain only one elastomer or may contain two or more elastomers. When the resin composition contains two or more elastomers, the total amount is preferably in the above range.

In addition, the resin composition in the present embodiment can also be configured to contain substantially no elastomer. "To contain substantially no" means that the content of the elastomer is less than 0.1 parts by mass per 100 parts by mass of the resin solid content in the resin composition.

Silane Coupling Agent

The resin composition according to the present embodiment may further contain a silane coupling agent. The resin composition containing a silane coupling agent tends to further improve dispersibility of a filler (D) described later and adhesive strength between the resin components, the filler (D), and a substrate described later.

The silane coupling agent is any silane coupling agent commonly used in surface treatment of inorganic materials and is not particularly limited, but examples include vinylsilane-based compounds, such as vinyltrimethoxysilane; styrylsilane-based compounds, such as p-styryltrimethoxysilane; aminosilane-based compounds, such as γ-aminopropyltriethoxysilane and N-β-(aminoethyl)-γ-aminopropyltrimethoxysilane; epoxysilane-based compounds, such as γ-glycidoxypropyltrimethoxysilane; acrylic silane-based compounds, such as γ-acryloxypropyltrimethoxysilane; cationic silane-based compounds, such as N-β-(N-vinylbenzylaminoethyl)-γ-aminopropyltrimethoxysilane hydrochloride; and phenylsilane-based compounds. One silane coupling agent may be used alone, or two or more may be used in combination.

When the resin composition of the present embodiment contains the silane coupling agent, the lower limit of the content of the silane coupling agent is preferably 0.005 parts by mass or greater, more preferably 0.01 parts by mass or greater, and even more preferably 0.1 parts by mass or greater per 100 parts by mass of the resin solid content in the resin composition. In addition, the upper limit of the content of the silane coupling agent is preferably 10 parts by mass or less, more preferably 5 parts by mass or less, and even more preferably 2 parts by mass or less per 100 parts by mass of the resin solid content in the resin composition.

One silane coupling agent can be used alone, or two or more can be used in combination. When two or more silane coupling agents are used, the total amount is in the above range.

Active Ester Compound

The resin composition according to the present embodiment may contain an active ester compound.

The active ester compound is not particularly limited, and examples include compounds containing two or more (preferably from 2 to 12, more preferably from 2 to 6, even more preferably from 2 to 4, still more preferably 2 or 3, and yet more preferably 2) active ester groups per molecule.

The active ester compound may be a linear, branched, or cyclic compound. Among these, from the viewpoint of further improving the thermal resistance of the resulting cured product, the active ester compound is preferably an active ester compound obtained by reacting a carboxylic acid compound and/or a thiocarboxylic acid compound with a hydroxy compound and/or a thiol compound; more preferably an active ester compound obtained by reacting a carboxylic acid compound with one or more compounds selected from the group consisting of a phenolic compound, a naphthol compound, and a thiol compound; even more preferably an aromatic compound obtained by reacting a carboxylic acid compound with an aromatic compound containing a phenolic hydroxyl group and containing two or more active ester groups per molecule; and particularly preferably an aromatic compound obtained by reacting a compound containing at least two or more carboxylic acids per molecule with an aromatic compound containing a phenolic hydroxyl group and containing two or more active ester groups per molecule.

Examples of the carboxylic acid compound include one or more selected from the group consisting of benzoic acid, acetic acid, succinic acid, maleic acid, itaconic acid, phthalic acid, isophthalic acid, terephthalic acid, and pyromellitic acid. Among these, from the viewpoint of further improving the thermal resistance of the resulting cured product, the carboxylic acid compound is preferably one or more selected from the group consisting of succinic acid, maleic acid, itaconic acid, phthalic acid, isophthalic acid, and terephthalic acid, and more preferably one or more selected from the group consisting of isophthalic acid and terephthalic acid. Examples of the thiocarboxylic acid compound include one or more selected from thioacetic acid and thiobenzoic acid.

Examples of the phenolic compound or naphthol compound include one or more selected from the group consisting of hydroquinone, resorcin, bisphenol A, bisphenol F, bisphenol S, phenolphthaline, methylated bisphenol A, methylated bisphenol F, methylated bisphenol S, phenol, o-cresol, m-cresol, p-cresol, catechol, α-naphthol, β-naphthol, 1,5-dihydroxynaphthalene, 1,6-dihydroxynaphthalene, 2,6-dihydroxynaphthalene, dihydroxybenzophenone, trihydroxybenzophenone, tetrahydroxybenzophenone, phloroglucin, benzenetriol, dicyclopentadienyl diphenol, and phenol novolac. From the viewpoints of further improving the thermal resistance and solubility of the resulting cured product in a solvent, the phenolic compound or naphthol compound is preferably bisphenol A, bisphenol F, bisphenol S, methylated bisphenol A, methylated bisphenol F, methylated bisphenol S, catechol, α-naphthol, β-naphthol, 1,5-dihydroxynaphthalene, 1,6-dihydroxynaphthalene, 2,6-dihydroxynaphthalene, dihydroxybenzophenone, trihydroxybenzophenone, tetrahydroxybenzophenone, phloroglucin, benzenetriol, dicyclopentadienyl diphenol, or phenol novolac; more preferably one or more selected from the group consisting of catechol, 1,5-dihydroxynaphthalene, 1,6-dihydroxynaphthalene, 2,6-dihydroxynaphthalene, dihydroxybenzophenone, trihydroxybenzophenone, tetrahydroxybenzophenone, phloroglucin, benzenetriol, dicyclopentadienyl diphenol, and phenol novolac; even more preferably one or more selected from the group consisting of 1,5-dihydroxynaphthalene, 1,6-dihydroxynaphthalene, 2,6-dihydroxynaphthalene, dihydroxybenzophenone, trihydroxybenzophenone, tetrahydroxybenzophenone, dicyclopentadienyl diphenol, and phenol novolac; and particularly preferably one or more selected from the group consisting of dihydroxybenzophenone, trihydroxybenzophenone, tetrahydroxybenzophenone, dicyclopentadienyl diphenol, and phenol novolac (preferably one or more selected from the group consisting of dicyclopentadienyl diphenol and phenol novolak, and more preferably dicyclopentadienyl diphenol).

Examples of the thiol compound include one or more selected from the group consisting of benzenedithiol and triazinedithiol. In addition, from the viewpoint of further improving compatibility with the epoxy compound, the active ester compound is preferably a compound containing at least two or more carboxylic acids per molecule and containing an aliphatic chain. From the viewpoint of further improving the thermal resistance, the active ester compound is preferably a compound containing an aromatic ring. More specific examples of the active ester compound include the active ester compounds described in JP 2004-277460 A.

A commercially available active ester compound may be used, or the active ester compound may be prepared by a known method. Examples of the commercially available product include compounds containing a dicyclopentadienyl diphenol structure (e.g., such as EXB9451, EXB9460, EXB9460S, and HPC-8000-65T (all available from DIC Corporation)), an acetylated phenol product of phenol novolac (e.g., DC808 (available from Mitsubishi Chemical Corporation)), and a benzoylated product of phenol novolac (e.g., YLH1026, YLH1030, and YLH1048 (all available from Mitsubishi Chemical Corporation)). From the viewpoints of further improving the storage stability of varnish and the low thermal expansion coefficient when the resin composition is cured (the low thermal expansion coefficient of the cured product), EXB9460S is preferred.

The active ester compound can be prepared by a known method and can be obtained, for example, by a condensation reaction of a carboxylic acid compound and a hydroxy compound. Specific examples include a method of reacting (a) a carboxylic acid compound or its halide, (b) a hydroxy compound, and (c) an aromatic monohydroxy compound at a ratio from 0.05 to 0.75 mol of a phenolic hydroxyl group of (b) and from 0.25 to 0.95 mol of (c) per mol of the carboxy group or acid halide group of (a).

The active ester compound is preferably contained within a range that does not impair the effects of the present invention. When the resin composition of the present embodiment contains the active ester compound, the active ester compound is preferably 1 part by mass or greater and preferably 90 parts by mass or less per 100 parts by mass of the resin solid content in the resin composition.

The resin composition in the present embodiment may contain only one active ester compound or may contain two or more active ester compounds. When the resin composition contains two or more active ester compounds, the total amount is preferably in the above range.

In addition, the resin composition in the present embodiment can also be configured to contain substantially no active ester compound. "To contain substantially no" means that the content of the active ester compound is less than 1 part by mass per 100 parts by mass of the resin solid content in the resin composition.

(D) Filler

The resin composition according to the present embodiment preferably contains a filler (D). Blending the filler (D) enables further improvement of the low dielectric constant properties, low dielectric loss tangent properties, flame resistance, and low thermal expansion properties of the resin composition.

In addition, the filler (D) used in the present embodiment preferably has excellent dielectric properties. For example, the filler (D) used in the present embodiment has a dielectric constant (Dk) measured according to a cavity resonance perturbation method of preferably 8.0 or lower and more preferably 6.0 or lower. Furthermore, the lower limit of the dielectric constant is, for example, practically 2.0 or higher. In addition, the filler (D) used in the present embodiment has a dielectric loss tangent (Df) measured according to a cavity resonance perturbation method of preferably 0.05 or lower and more preferably 0.01 or lower. Furthermore, the lower limit of the dielectric loss tangent is, for example, practically 0.0001 or higher.

A kind of the filler (D) used in the present embodiment is not particularly limited, and fillers commonly used in the art can be suitably used as the filler (D). Specifically, examples of the fillers include silica, such as natural silica, fused silica, synthetic silica, amorphous silica, Aerosil, and hollow silica; metal hydrates, such as white silica powder, titanium white, zinc oxide, magnesium oxide, zirconium oxide, boron nitride, aggregated boron nitride, silicon nitride, aluminum nitride, barium sulfate, aluminum hydroxide, and an aluminum hydroxide heat-treated product (a product obtained by heating aluminum hydroxide to reduce a part of the crystalline water), boehmite, and magnesium hydroxide; molybdenum compounds, such as molybdenum oxide and zinc molybdate; inorganic-based fillers, such as zinc borate, zinc stannate, alumina, clay, kaolin, talc, calcined clay, calcined kaolin, calcined talc, mica, E-glass, A-glass, NE-glass, C-glass, L-glass, D-glass, S-glass, M-glass G20, glass short fibers (including glass fine powders of E glass, T glass, D glass, S glass, Q glass, and the like), hollow glass, and spherical glass; and in addition, organic-based fillers, such as rubber powders (such as styrene, butadiene, and acrylic rubber powders), core-shell rubber powders, silicone resin powders, silicone rubber powders, and silicone composite powders.

Among these, one kind, or two or more kinds selected from the group consisting of silica, aluminum hydroxide, boehmite, magnesium oxide, and magnesium hydroxide are preferable. Using such a filler improves properties such as the thermal expansion, dimensional stability, and flame retardancy of the resin composition.

The content of the filler (D) in the resin composition of the present embodiment can be appropriately set according to the desired properties and is not particularly limited but is preferably 50 parts by mass or greater and more preferably 75 parts by mass or greater per 100 parts by mass of the resin solid content in the resin composition. In addition, the content of the filler (D) is preferably 1600 parts by mass or less, more preferably 1200 parts by mass or less, even more preferably 1000 parts by mass or less, still more preferably 750 parts by mass or less, yet more preferably 500 parts by mass or less, still even more preferably 300 parts by mass or less per 100 parts by mass of the resin solid content in the resin composition, and may be 250 parts by mass or less or 200 parts by mass or less In the resin composition according to the present embodiment, an aspect in which the content of the filler (D) is from 30 mass % to 80 mass % of components excluding a solvent is exemplified as an example of a preferred embodiment.

The resin composition in the present embodiment may contain only one kind of filler (D) or contain two or more kinds of filler (D). When the resin composition contains two or more kinds of filler (D), their total amount is preferably in the above range.

Flame Retardant

The resin composition of the present embodiment may contain a flame retardant.

For the flame retardant, known flame retardants can be used, and examples include halogen-based flame retardants, such as brominated epoxy resins, brominated polycarbonates, brominated polystyrenes, brominated styrenes, brominated phthalimides, tetrabromobisphenol A, pentabromobenzyl (meth)acrylate, pentabromotoluene, tribromophenol, hexabromobenzene, decabromodiphenyl ether, bis-1,2-pentabromophenylethane, chlorinated polystyrenes, and chlorinated paraffins; phosphorus-based flame retardants, such as red phosphorus, tricresyl phosphate, triphenyl phosphate, cresyl diphenyl phosphate, trixylenyl phosphate, trialkyl phosphate, dialkyl phosphate, tris(chloroethyl) phosphate, phosphazene, 1,3-phenylene bis(2,6-dixylenylphosphate), and 10-(2,5-dihydroxyphenyl)-10H-9-oxa-10-phosphaphenanthrene-10-oxide; inorganic-based flame retardants, such as aluminum hydroxide, magnesium hydroxide, partial boehmite, boehmite, zinc borate, and antimony trioxide; and silicone-based retardants, such as silicone rubbers and silicone resins. These flame retardants may be used alone, or two or more in combination. Among these, 1,3-phenylene bis(2,6-dixylenylphosphate) does not impair the low dielectric properties and thus is preferred.

When the resin composition according to the present embodiment contains the flame retardant, the content of the flame retardant is preferably 0.1 parts by mass or greater, and preferably 20 parts by mass or less and more preferably 10 parts by mass or less of the resin composition.

One flame retardant can be used alone, or two or more flame retardants can be used in combination. When two or more flame retardants are used, the total amount is in the above range.

Dispersant

The resin composition of the present embodiment may contain a dispersant. For the dispersant, dispersants commonly used in paints can be suitably used, and the type of dispersant is not particularly limited. For the dispersant, a copolymer-based wet dispersant is preferably used, and its specific examples include DISPERBYK (trade name)-110, 111, 161, 180, 2009, 2152, 2155, BYK (trade name)-W996, W9010, W903, and W940 available from BYK Japan KK.

When the resin composition of the present embodiment contains the dispersant, the lower limit of the content of the dispersant is preferably 0.01 parts by mass or greater, more preferably 0.1 parts by mass or greater, and may be 0.3 parts by mass or greater per 100 parts by mass of the resin solid content in the resin composition. The upper limit of the content of the dispersant is preferably 10 parts by mass or less, more preferably 5 parts by mass or less, and even more preferably 3 parts by mass or less per 100 parts by mass of the resin solid content in the resin composition.

One dispersant can be used alone, or two or more dispersants can be used in combination. When two or more dispersants are used, the total amount is in the above range.

Curing Accelerator

The resin composition according to the present embodiment may further contain a curing accelerator. The curing accelerator is not particularly limited, but examples include imidazoles, such as triphenylimidazole; organic peroxides, such as benzoyl peroxide, lauroyl peroxide, acetyl peroxide, parachlorobenzoyl peroxide, and di-tert-butyl-di-perphthalate; azo compounds, such as azobisnitrile; tertiary amines, such as N,N-dimethylbenzylamine, N,N-dimethylaniline, N,N-dimethyltoluidine, 2-N-ethylanilinoethanol, tri-n-butylamine, pyridine, quinoline, N-methylmorpholine, triethanolamine, triethylenediamine, tetramethylbutanediamine, and N-methylpiperidine; phenols, such as phenol, xylenol, cresol, resorcin, and catechol; organometallic salts, such as lead naphthenate, lead stearate, zinc naphthenate, zinc octylate, manganese octylate, tin oleate, dibutyltin malate, manganese naphthenate, cobalt naphthenate, and iron acetylacetone; those formed by dissolving these organometallic salts in hydroxyl group-containing compounds, such as phenol and bisphenol; inorganic metal salts, such as tin chloride, zinc chloride, and aluminum chloride; and organotin compounds, such as dioctyl tin oxide and other alkyl tins, and alkyl tin oxides.

Preferred curing accelerators are an imidazole and an organometallic salt, and more preferably both an imidazole and an organometallic salt are used in combination.

When the resin composition of the present embodiment contains the curing accelerator, the lower limit of the content of the curing accelerator is preferably 0.005 parts by mass or greater, more preferably 0.01 parts by mass or greater, and even more preferably 0.1 parts by mass or greater per 100 parts by mass of the resin solid content in the resin composition. In addition, the upper limit of the content of the curing accelerator is preferably 10 parts by mass or less, more preferably 5 parts by mass or less, and even more preferably 2 parts by mass or less per 100 parts by mass of the resin solid content in the resin composition.

One curing accelerator can be used alone, or two or more curing accelerators can be used in combination. When two or more curing accelerators are used, the total amount is in the above range.

Solvent

The resin composition according to the present embodiment may contain a solvent and preferably contains an organic solvent. The resin composition according to the present embodiment containing a solvent is in a form (solution or varnish) in which at least one or some, or preferably all of the various resin solid contents described above are dissolved or homogeneously mixed in the solvent. The solvent includes any polar organic solvent or any non-polar organic solvent capable of dissolving or homogeneously mixing at least one or some, or preferably all of the various resin solid contents described above and is not particularly limited. Examples of the polar organic solvent include ketones (e.g., such as acetone, methyl ethyl ketone, and methyl isobutyl ketone), Cellosolves (e.g., such as propylene glycol monomethyl ether and propylene glycol monomethyl ether acetate), esters (e.g., such as ethyl lactate, methyl acetate, ethyl acetate, butyl acetate, isoamyl acetate, ethyl lactate, methyl methoxypropionate, and methyl hydroxyisobutyrate), and amides (e.g., such as dimethoxyacetamide and dimethylformamide). Examples of the non-polar organic solvent include aromatic hydrocarbons (e.g., such as toluene and xylene).

One solvent can be used alone, or two or more solvents can be used in combination. When two or more solvents are used, the total amount is in the above range.

Other Component

The resin composition according to the present embodiment may contain a macromolecular compound of various types, such as a thermoplastic resin and its oligomer, and an additive of various types in addition to the components described above. Examples of the additive include ultraviolet absorbers, antioxidants, photopolymerization initiators, fluorescent whitening agents, photosensitizers, dyes, pigments, thickeners, flow control agents, lubricants, antifoaming agents, leveling agents, brighteners, and polymerization inhibitors. One of these additives can be used alone, or two or more can be used in combination.

Applications

The resin composition of the present embodiment is used as a cured product. Specifically, the resin composition according to the present embodiment can be suitably used as a low dielectric constant material and/or a low dielectric loss tangent material, and as a resin composition for an electronic material, such as an insulating layer of a printed wiring board or a material for a semiconductor package. The resin composition according to the present embodiment can be suitably used as a material for a prepreg, a metal foil-clad laminate formed using the prepreg, a resin sheet, and a printed wiring board.

The resin composition according to the present embodiment is used as a layered material (intended to include a film shape, a sheet shape, and the like), such as an insulating layer of a printed wiring board, a prepreg, or a resin sheet. When the resin composition is formed into such a layered material, the thickness of the layered material is preferably 5 µm or greater and more preferably 10 µm or greater. The upper limit of the thickness is preferably 200 µm or less and more preferably 180 µm or less. The thickness of the layered material means, for example, a thickness including a glass cloth when the glass cloth or such is impregnated with the resin composition of the present embodiment.

The material formed from the resin composition of the present embodiment may be used in an application to form a pattern by exposure and development or may be used in an application not involving exposure and development. In particular, the material is suitable for an application not involving exposure and development.

Prepreg

A prepreg according to the present embodiment is formed from a substrate (prepreg substrate) and the resin composition of the present embodiment. The prepreg according to the present embodiment is obtained, for example, by applying the resin composition of the present embodiment to a substrate (e.g., impregnating and/or coating the substrate with the resin composition) and then semi-curing the resin composition by heating (e.g., such as a method of drying at 120 to 220° C. for 2 to 15 minutes). In this case, the amount of the resin composition adhered to the substrate, that is, the amount of the resin composition (including the filler (D)) relative to the total amount of the prepreg after semi-curing is preferably in a range of 20 to 99 mass % and more preferably in a range of 20 to 70 mass %.

The substrate is any substrate used in various printed wiring board materials and is not particularly limited. Examples of the material of the substrate include glass fibers (e.g., such as E-glass, D-glass, L-glass, S-glass, T-glass, Q-glass, UN-glass, NE-glass, and spherical glass), inorganic fibers other than glass (e.g., such as quartz), and organic fibers (e.g., such as polyimide, polyamide, polyester, liquid crystal polyester, and polytetrafluoroethylene). The form of the substrate is not particularly limited, and examples include woven fabrics, nonwoven fabrics, rovings, chopped strand mats, and surfacing mats. A substrate of these can be used alone, or two or more can be used in combination. Among these substrates, from the viewpoint of dimensional stability, the substrate is preferably a woven fabric subjected to ultra fiber opening and fine weaving; from the viewpoints of strength and low water absorption, the substrate is preferably a glass woven fabric with a thickness of 200 µm or less and a mass of 250 g/m$^2$ or less; and from the viewpoint of moisture absorption thermal resistance, the substrate is preferably a glass woven fabric surface-treated with a silane coupling agent or the like, such as an epoxy silane treatment or an aminosilane treatment. From the viewpoint of electrical properties, the substrate is more preferably a low dielectric glass cloth made of a glass fiber, such as a glass fiber of L-glass, NE-glass, or Q-glass, achieving low dielectric constant properties and low dielectric loss tangent properties.

The low dielectric constant substrate is exemplified by a substrate with a dielectric constant of 5.0 or lower (preferably from 3.0 to 4.9). The low dielectric loss tangent substrate is exemplified by a substrate with a dielectric loss tangent of 0.006 or lower (preferably from 0.001 to 0.005). The dielectric constant and dielectric loss tangent are values measured with a perturbation cavity resonator at 10 GHz.

Metal Foil-Clad Laminate

A metal foil-clad laminate according to the present embodiment includes a layer formed from at least one prepreg of the present embodiment, and a metal foil disposed on one or both sides of the layer formed from the prepreg. Examples of the method for producing a metal foil-clad laminate according to the present embodiment include a method of disposing at least one prepreg (preferably stacking two or more prepregs) of the present embodiment, disposing a metal foil on one or both sides of the prepreg, and laminate-molding the metal foil and the prepreg. More specifically, the metal foil-clad laminate can be produced by disposing a metal foil of copper, aluminum, or the like on one side or both sides of the prepreg, and laminate-molding the metal foil and the prepreg. The number of prepreg(s) is preferably from 1 to 10, more preferably from 2 to 10, and even more preferably from 2 to 9. The metal foil is any metal foil used in materials for printed wiring boards and is not particularly limited, but examples include a copper foil, such as a rolled copper foil and an electrolytic copper foil. The thickness of the metal foil (preferably a copper foil) is not particularly limited and may be approximately from 1.5 to 70 μm. Examples of the molding method include methods commonly used in molding a laminate and a multilayer board for a printed wiring board, and more particularly include a method of laminate-molding using a multi-stage press, a multi-stage vacuum press, a continuous molding machine, an autoclave molding machine, or the like at a temperature of approximately 180 to 350° C., a heating time of approximately 100 to 300 minutes, and a surface pressure of approximately 20 to 100 kg/cm$^2$. In addition, the prepreg according to the present embodiment is combined and laminate-molded with a separately produced wiring board for an inner layer and can also be formed into a multilayer board. In a method of manufacturing a multilayer board, a multilayer board can be produced, for example, by disposing copper foils of approximately 35 μm on both sides of one prepreg of the present embodiment, laminate-molding them by the molding method described above, then forming an inner layer circuit, subjecting the inner layer circuit to a blackening treatment to form an inner layer circuit board, then alternately disposing the inner layer circuit board and the prepreg of the present embodiment one by one, and further disposing a copper foil on the outermost layer, followed by lamination molding under the conditions above preferably under vacuum. The metal foil-clad laminate of the present embodiment can be suitably used as a printed wiring board.

The metal foil-clad laminate according to the present embodiment preferably has a low dielectric constant (Dk) measured using a laminate A from which the metal foil is etched away. Specifically, the dielectric constant (Dk) of the laminate A is preferably 4.3 or lower and more preferably 4.1 or lower. The lower limit of the dielectric constant (Dk) is not particularly specified but is, for example, practically 3.0 or higher.

In addition, the metal foil-clad laminate according to the present embodiment preferably has a low dielectric loss tangent (Df) measured using a laminate A from which the metal foil is etched away. Specifically, the dielectric loss tangent (Df) is preferably 0.0060 or lower and more preferably 0.0050 or lower. The lower limit of the dielectric loss tangent (Df) is not particularly specified but is, for example, practically 0.0027 or higher.

The dielectric constant (Dk) and the dielectric loss tangent (Df) are measured according to a method described in Examples below.

In addition, the metal foil-clad laminate according to the present embodiment preferably has a high glass transition temperature measured using a laminate A from which the metal foil is etched away. Specifically, the glass transition temperature of the laminate A is, for example, preferably 250° C. or higher and more preferably 270° C. or higher. The upper limit of the glass transition temperature is, for example, practically 400° C. or lower. The glass transition temperature is measured according to a description in Examples below.

The metal foil-clad laminate according to the present embodiment has a water absorption rate of preferably 0.35 mass % or lower and more preferably 0.25 mass % or lower after treated at 121° C. and 2 atm for 1 hour with a pressure cooker tester in accordance with JIS C 6485: 2008. The lower limit of the water absorption ratio is, for example, 0 mass %.

The metal foil-clad laminate according to the present embodiment has a water absorption rate of preferably 0.35 mass % or lower and more preferably 0.25 mass % or lower after treated at 121° C. and 2 atm for 5 hours with a pressure cooker tester in accordance with JIS C 6485: 2008. The lower limit of the water absorption ratio is, for example, 0 mass %.

As described above, the cured product of the resin composition for an electronic material obtained using the resin composition according to the present embodiment (resin composition made from a combination of specific components) has properties excellent in low water absorption in addition to thermal resistance and low dielectric properties (a low dielectric constant and a low dielectric loss tangent) and further excellent in chemical resistance and desmear resistance.

Printed Wiring Board

A printed wiring board according to the present embodiment is a printed wiring board including an insulating layer and a conductor layer disposed on the surface of the insulating layer, and the insulating layer includes at least one of a layer formed from the resin composition of the present embodiment or a layer formed from the prepreg of the present embodiment. Such a printed wiring board can be manufactured by a common method, and the manufacturing method is not particularly limited. An example of the method of manufacturing the printed wiring board is described below. First, a metal foil-clad laminate such as the metal foil-clad laminate described above is prepared. Next, the surface of the metal foil-clad laminate is subjected to an etching treatment to form an inner layer circuit, and an inner layer substrate is produced. The inner layer circuit surface of the inner layer substrate is subjected to surface treatment to increase the adhesive strength as necessary, then a required number of the prepregs described above are layered on the inner layer circuit surface, a metal foil for an outer layer circuit is further laminated on the outer side, and the laminate is heated, pressurized, and integrally molded. A multilayer laminate is thus manufactured with an insulating layer composed of a substrate and a cured product of the resin composition formed between the inner layer circuit and the metal foil for the outer layer circuit. The multilayer laminate is then subjected to hole formation for a through hole or a via hole, then a plated metal film for conduction between the inner layer circuit and the metal foil for the outer layer circuit is formed on the wall surface of the hole, and furthermore, the metal foil for the outer layer circuit is subjected to an etching treatment to form the outer layer circuit, and thereby the printed wiring board is manufactured.

The printed wiring board obtained in the above manufacturing example is configured to have an insulating layer and a conductor layer formed on the surface of the insulating layer, and the insulating layer is configured to contain the resin composition according to the present embodiment described above and/or its cured product. That is, the prepreg of the present embodiment described above (e.g., a prepreg formed from a substrate and the resin composition of the present embodiment impregnated into or applied onto the substrate) and the layer formed from the resin composition on the metal foil-clad laminate of the present embodiment described above serve as the insulating layer of the present embodiment.

Resin Sheet

A resin sheet according to the present embodiment includes a support and a layer formed from the resin composition of the present embodiment and disposed on the surface of the support. The resin sheet can be used as a build-up film or a dry film solder resist. The method of manufacturing the resin sheet is not particularly limited, but examples include a method of obtaining the resin sheet by coating (painting) the support with a solution of the resin composition of the present embodiment described above dissolved in a solvent, and then drying.

Examples of the support used here include, but are not limited to, organic-based film substrates, such as polyethylene films, polypropylene films, polycarbonate films, poly (ethylene terephthalate) films, ethylene tetrafluoroethylene copolymer films, as well as release films formed by coating a surface of a film of these with a release agent, and polyimide films; conductive foils, such as copper foils and aluminum foils; and plate-like supports, such as glass plates, steel use stainless (SUS) plates, and fiber-reinforced plastics (FRPs).

Examples of the coating method (painting method) include a method of using a bar coater, a die coater, a doctor blade, a Baker applicator, or the like to coat a support with a solution of the resin composition of the present embodiment dissolved in a solvent. In addition, the support is released or etched from the resin sheet in which the support and the resin composition are laminated and can also be formed into a monolayer sheet. Furthermore, a monolayer sheet can also be obtained without using a support, for example, by feeding a solution of the resin composition of the present embodiment described above dissolved in a solvent into a mold containing a sheet-shaped cavity and drying the solution to mold into a sheet shape.

In the production of the monolayer sheet or the resin sheet according to the present embodiment, the drying conditions in removing the solvent are not particularly limited. However, drying at low temperature is likely to allow the solvent to remain in the resin composition, and drying at high temperature allows the curing of the resin composition to proceed, and thus the conditions are preferably a temperature of 20 to 200° C. for 1 to 90 minutes. In addition, the monolayer sheet or resin sheet can be used in an uncured state where the solvent is only dried or can be used as necessary in a semi-cured (B-staged) state. Furthermore, the thickness of the resin layer in the monolayer sheet or resin sheet according to the present embodiment can be adjusted by the concentration of the solution of the resin composition of the present embodiment and the coating thickness and is not particularly limited. However, in general, as the thickness of the coating increases, the solvent is likely to remain during drying, and thus the thickness is preferably from 0.1 to 500 μm.

EXAMPLES

The present invention will be described more specifically with reference to examples below. Materials, amounts used, proportions, processing details, processing procedures, and the like described in the following examples can be appropriately changed as long as they do not depart from the spirit of the present invention. Thus, the scope of the present invention is not limited to the specific examples described below.

If a measuring device used in the examples is not readily available due to discontinuation or the like, another device with equivalent performance can be used for measurement.

Synthesis Example 1: Synthesis of Naphthol Aralkyl-Type Cyanate Ester Compound (SNCN)

In 1800 g of dichloromethane, 300 g (1.28 mol in terms of OH group) of a 1-naphthol aralkyl resin (available from Nippon Steel & Sumikin Materials Co., Ltd.) and 194.6 g (1.92 mol) of triethylamine (1.5 mol per mol of hydroxy group) were dissolved, and this was used as a solution 1.

While 125.9 g (2.05 mol) of cyanogen chloride (1.6 mol per mol of hydroxy group), 293.8 g of dichloromethane, 194.5 g (1.92 mol) of 36% hydrochloric acid (1.5 mol per mol of hydroxy group), and 1205.9 g of water were kept at a liquid temperature of −2 to −0.5° C. under stirring, the solution 1 was poured over 30 minutes. After completion of pouring the solution 1, the mixture was stirred at the same temperature for 30 min, then a solution (solution 2) of 65 g (0.64 mol) of triethylamine (0.5 mol per hydroxy group) dissolved in 65 g of dichloromethane was poured over 10 minutes. After completion of pouring the solution 2, the mixture was stirred at the same temperature for 30 minutes, and the reaction was completed.

The reaction solution was then allowed to stand, and the organic phase and the aqueous phase were separated. The resulting organic phase was washed with 1300 g of water 5 times. The electrical conductivity of the wastewater from the fifth water washing was 5 μS/cm, confirming that removable ionic compounds were sufficiently removed by washing with water.

The organic phase after washing with water was concentrated under reduced pressure and finally concentrated to dryness at 90° C. for 1 hour, and 331 g of the target naphthol aralkyl-type cyanate ester compound (SNCN) (orange viscous material) was obtained. The weight average molecular weight of the resulting SNCN was 600. In addition, the IR spectrum of the SNCN showed an absorption (of a cyanate ester group) at 2250 $cm^1$ and showed no absorption of a hydroxy group.

Example 1

In methyl ethyl ketone 50 parts by mass of a compound (A) represented by Formula (M1) ("X9-450" available from DIC Corporation, a compound (A) represented by Formula (M1)), 50 parts by mass of the naphthol aralkyl-type cyanate ester compound obtained in Synthesis Example 1 (SNCN, a cyanate ester compound containing two or more aromatic moieties per molecule, the aromatic moiety replaced by at least one cyanato group), 100 parts by mass of a fused silica ("SC2050-MNU", average particle size 0.5 μm (available from Admatechs Company Limited)), and 0.2 parts by mass of manganese octoate (catalyst) were dissolved and mixed, and a varnish was obtained. Each addition amount described above represents the solid content. This varnish was further diluted with methyl ethyl ketone and applied by impregnation to a 0.094-mm thick E glass woven fabric (product number: 2116, available from Arisawa Manufacturing Co., Ltd.), dried by heating at 150° C. for 5 minutes, and a prepreg with a resin composition amount (including the filler) of 60 mass %, a E glass woven fabric (glass cloth amount) of 40 mass %, and a thickness of 100 μm was obtained.

Eight of the resulting prepregs were stacked, and electrolytic copper foils with a thickness of 12 μm were disposed on the top and bottom. These were laminate-molded at a pressure of 30 kgf/$cm^2$ and a temperature of 220° C. for 120 minutes, and a metal foil-clad laminate with an insulating layer thickness of 0.8 mm was obtained. For the 12-μm electrolytic copper foil, a 3EC-M3-VLPs available from Mitsui Mining & Smelting Co., Ltd. was used. The resulting metal foil-clad laminate was used to evaluate moldability (presence or absence of a void), peel strength, glass transition temperature (Tg), a dielectric constant (Dk), a dielectric loss tangent (Df), water absorption rate, chemical resistance, and desmear resistance. The evaluation results are shown in Table 1.

Methods of Measurement and Evaluation (1) Moldability (Presence of Voids)

The internal appearance (insulating layer) of the metal foil-clad laminate was visually observed, and a laminate in which voids were observed was determined as "Yes" and a laminate in which no void was observed was determined as "No".

(2) Peel Strength

For the peel strength, the peel strength of the copper foil was measured in accordance with JIS-C 6481: 1996 using the metal foil-clad laminate.

The unit was expressed in kg/cm.

(3) Glass Transition Temperature (Tg)

The glass transition temperature was determined by measuring dynamic viscoelasticity of a laminate (hereinafter referred to as the "laminate A") from which a copper foil of the metal foil-clad laminate was etched away. The measurement was in accordance with JIS-K 7244-4: 1999 (Plastics-Test Methods for Dynamic Mechanical Properties-Part 4: Tensile Vibration-Non-Resonant Method) using a dynamic viscoelasticity analyzer (DMA) with a starting temperature of 30° C., an ending temperature of 400° C., a temperature rise rate of 5° C./min, a measurement frequency of 1 Hz, and under a nitrogen atmosphere, and the maximum value of the loss tangent (tan δ) obtained in the measurement was taken as the glass transition temperature.

For the dynamic viscoelasticity analyzer, an EXSTAR 6000 DMS6100 available from Seiko Instruments Inc. was used.

The glass transition temperature was evaluated as follows.
A: 270° C. or higher
B: 250° C. or higher and lower than 270° C.
C: 230° C. or higher and lower than 250° C.
D: lower than 230° C.

(4) Dielectric Constant (Dk) and Dielectric Loss Tangent (Df):

The dielectric constant (Dk) and dielectric loss tangent (Df) at 10 GHz were measured using the laminate A with a perturbation cavity resonator.

For the perturbation cavity resonator, an Agilent 8722ES available from Agilent Technologies was used.

The Dk and Df were evaluated as follows:
Dk
A: 4.1 or lower
B: higher than 4.1 and 4.3 or lower
C: higher than 4.3
Df
A: 0.0050 or lower
B: higher than 0.0050 and 0.0060 or lower
C: higher than 0.0060

In addition, the laminate A was allowed to stand under conditions of 121° C. and 2 atm for 5 hours with a pressure cooker tester, and then the Dk and Df were measured in the same manner as described above.

The Dk and Df were evaluated as follows:
Dk (After Water Absorption)
A: 4.2 or lower
B: higher than 4.2 and 4.3 or lower
C: higher than 4.3

Df (After Water Absorption)
A: 0.0110 or lower
B: higher than 0.0110 and 0.0120 or lower
C: higher than 0.0120 and 0.0130 or lower
D: higher than 0.0130

(5) Water Absorption Rate:

In accordance with JIS C 6485: 2008, a sample obtained by cutting the laminate A to 30 mm×30 mm was treated with a pressure cooker tester at 121° C. and 2 atm for 1 hour and 5 hours, and then the water absorption rate was measured. In Table 1, "1 h" corresponds to the water absorption rate after 1-hour treatment, and "5 h" corresponds to the water absorption rate after 5-hour treatment.

For the pressure cooker tester, a PC-3 model available from Hirayama Manufacturing Corporation was used.

The water absorption rate was evaluated as follows:
A: 0.25 mass % or lower
B: higher than 0.25 mass % and 0.35 mass % or lower
C: higher than 0.35 mass %

(6) Chemical Resistance:

A sample obtained by cutting the laminate A to 50 mm×50 mm was immersed in a 60° C. hydrochloric acid aqueous solution adjusted to 4 N for 1 hour or 2 hours. The mass loss rate (mass %) was calculated from the mass of the laminate A before and after immersion. A smaller absolute value indicates superior chemical resistance (acid resistance). In addition, the sample was immersed in a 70° C. sodium hydroxide aqueous solution adjusted to 1 N for 1 hour or 2 hours. The mass loss rate (mass %) was calculated from the mass of the laminate A before and after immersion and indicated by an absolute value. A smaller absolute value indicates superior chemical resistance (alkali resistance).

The chemical resistance was evaluated as follows:
A: 0 mass % or higher and 0.4 mass % or lower
B: higher than 0.4 mass % and 1.0 mass % or lower
C: higher than 1.0 mass % and 2.0 mass % or lower
D: higher than 2.0 mass %

(7) Desmear Resistance:

The laminate A was treated by the following immersion. First, the laminate A was immersed in a swelling liquid (Swelling Dip Securiganth P available from Atotech Japan K.K.) at 80° C. for 10 minutes. The immersed laminate A was then immersed in a roughening liquid (Concentrate Compact CP available from Atotech Japan K.K.) at 80° C. for 5 minutes. The immersed laminate A was then immersed in a neutralization liquid (Reduction Conditioner Securiganth P500 available from Atotech Japan K.K.) at 45° C. for 10 minutes. The mass loss rates (mass %) of the laminate A after performing the series of immersion treatments once, after performing the series of immersion treatments twice, and after performing the series of immersion treatments three times were measured. In Table 1, "Once" corresponds to "the mass loss rate (mass %) after performing the immersion treatments once", "Twice" corresponds to "the mass loss rate (mass %) after performing the immersion treatments twice", and "Thrice" corresponds to "the mass loss rate (mass %) after performing the immersion treatments three times". The numerical values were indicated in absolute values.

The desmear resistance was evaluated as follows:
A: 1.0 mass % or lower
B: higher than 1.0 mass % and 2.0 mass % or lower
C: higher than 2.0 mass %

Example 2

In Example 1, the naphthol aralkyl-type cyanate ester compound (SNCN) was changed to the same amount of a bisphenol A-type cyanate ester compound (product number CYTESTER (trade name) TA available from Mitsubishi Gas Chemical Company, Inc.), the added amount of manganese octoate (catalyst) was changed from 0.2 parts by mass to 0.3 parts by mass, and other procedures were performed in the same manner. The results are shown in Table 1.

Comparative Example 1

In Example 1, the compound (A) represented by Formula (M1) ("X9-450" available from DIC Corporation) was changed to the same amount of a compound with a structure shown below (BMI-70 (trade name) available from K-I Chemical Industry Co., Ltd.), the added amount of manganese octoate (catalyst) was changed from 0.2 parts by mass to 0.4 parts by mass, and other procedures were performed in the same manner. The results are shown in Table 1. Product of K-I Chemical Industry Co., Ltd.

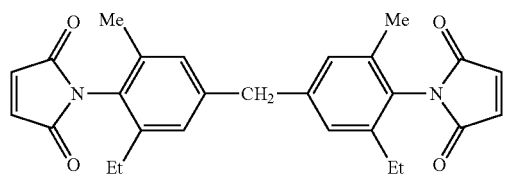 [SMILES: CCc1cc(Cc2cc(C)c(N3C(=O)C=CC3=O)c(CC)c2)cc(C)c1N1C(=O)C=CC1=O]

In the compound shown above, Me represents a methyl group, and Et represents an ethyl group.

Comparative Example 2

In Example 1, the compound (A) represented by Formula (M1) ("X9-450" available from DIC Corporation) was changed to the same amount of a compound with a structure shown below (BMI-2300 (trade name) available from Daiwa Kasei Industry Co., Ltd.), the added amount of manganese octoate (catalyst) was changed from 0.2 parts by mass to 0.15 parts by mass, and other procedures were performed in the same manner. The results are shown in Table 1.

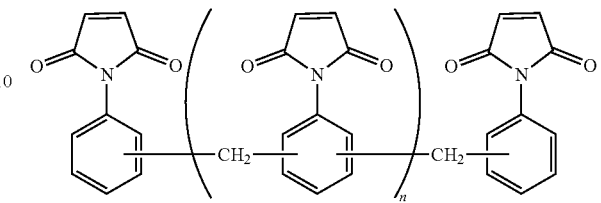

Comparative Example 3

In Example 1, the compound (A) represented by Formula (M1) ("X9-450" available from DIC Corporation) was changed to the same amount of a maleimide compound with a structure shown below (MIR-3000 (trade name) available from Nippon Kayaku Co., Ltd.), and other procedures were performed in the same manner. The results are shown in Table 1.

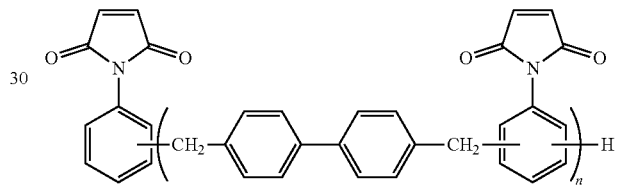

TABLE 1

|  |  | Example 1 | Example 2 | Comparative Example 1 | Comparative Example 2 | Comparative Example 3 |
|---|---|---|---|---|---|---|
| Moldability (presence of voids) | | No | Yes | No | No | No |
| Peak (kg/cm) | | 0.33 | 0.68 | 0.57 | 0.70 | 0.68 |
| Tg @ DMA (° C.) tan δ | | A | B | C | B | A |
| Dk (—) | | A | A | B | C | B |
| Df (—) | | A | B | B | B | B |
| Dk (—) after 5-hour moisture absorption | | A | A | B | C | C |
| Df (—) after 5-hour moisture absorption | | A | C | A | C | A |
| Water absorption rate (mass %) | 1 h | A | B | B | A | A |
|  | 5 h | B | C | C | C | C |
| Chemical resistance (mass %) | Treated with 4N HCl for 60 min | A | A | A | A | A |
|  | Treated with 4N HCl for 120 min | A | A | A | A | A |
|  | Treated with 1N NaOH for 60 min | A | B | A | B | A |
|  | Treated with 1N NaOH for 120 min | A | C | B | C | B |
| Desmear resistance (mass %) | Once | A | A | A | A | A |
|  | Twice | A | B | B | B | B |
|  | Thrice | B | C | B | B | B |

Industrial Applicability

As described above, in various applications including electrical/electronic materials, machine tool materials, and aeronautical materials, the resin composition according to the present invention can be widely and effectively used, for example, as an electrical insulating material, a semiconductor plastic package, a sealing material, an adhesive, a laminate material, a resist, or a build-up laminate material, and can particularly be effectively used as a printed wiring board material that is compatible with high integration and high density of information terminal devices, communication tools, and the like in recent years. In addition, the metal foil-clad laminate and the like of the present invention have, in particular, low water absorption, chemical resistance, desmear resistance, and thermal resistance, and thus have extremely high industrial utility.

The invention claimed is:

1. A resin composition comprising a compound (A) represented by Formula (M1) and a cyanate ester compound (B) containing two or more aromatic moieties per molecule, the aromatic moieties being replaced by at least one cyanato group:

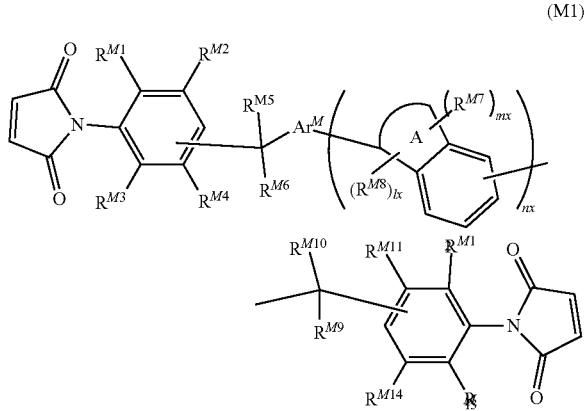

(M1)

wherein Formula (M1), $R^{M1}$, $R^{M2}$, $R^{M3}$, and $R^{M4}$ each independently represent a hydrogen atom or an organic group; $R^{M5}$ and $R^{M6}$ each independently represent a hydrogen atom or an alkyl group; $Ar^M$ represents a divalent aromatic group; A is a four- to six-membered alicyclic group; $R^{M7}$ and $R^{M8}$ are each independently an alkyl group; mx is 1 or 2; lx is 0 or 1; $R^{M9}$ and $R^{M10}$ each independently represent a hydrogen atom or an alkyl group; $R^{M11}$, $R^{M12}$, $R^{M13}$, and $R^{M14}$ each independently represent a hydrogen atom or an organic group; and nx represents an integer of 1 or greater and 20 or less, wherein the cyanate ester compound (B) includes a naphthol aralkyl-type cyanate ester compound.

2. The resin composition according to claim 1, wherein the compound (A) represented by Formula (M1) is contained in an amount from 1 to 90 parts by mass when a resin solid content in the resin composition is 100 parts by mass.

3. The resin composition according to claim 1, wherein the cyanate ester compound (B) containing two or more aromatic moieties per molecule, the aromatic moieties being replaced by at least one cyanato group, is contained in an amount from 1 to 90 parts by mass when a resin solid content in the resin composition is 100 parts by mass.

4. The resin composition according to claim 1, wherein the compound (A) represented by Formula (M1) is contained in an amount from 1 to 90 parts by mass and the cyanate ester compound (B) containing two or more aromatic moieties per molecule, the aromatic moieties being replaced by at least one cyanato group, is contained in an amount from 1 to 90 parts by mass when a resin solid content in the resin composition is 100 parts by mass.

5. The resin composition according to claim 1, further comprising a filler (D).

6. The resin composition according to claim 1, wherein the compound (A) represented by Formula (M1) is contained in an amount from 1 to 90 parts by mass and the cyanate ester compound (B) containing two or more aromatic moieties per molecule, the aromatic moieties being replaced by at least one cyanato group, is contained in an amount from 1 to 90 parts by mass when a resin solid content in the resin composition is 100 parts by mass; and the resin composition further comprises a filler (D).

7. The resin composition according to claim 5, wherein the filler (D) is contained in the resin composition in an amount from 50 to 1600 parts by mass per 100 parts by mass of the resin solid content.

8. The resin composition according to claim 1, wherein the compound (A) represented by Formula (M1) is contained in an amount from 1 to 90 parts by mass and the cyanate ester compound (B) containing two or more aromatic moieties per molecule, the aromatic moieties being replaced by at least one cyanato group, is contained in an amount from 1 to 90 parts by mass when a resin solid content in the resin composition is 100 parts by mass;

the resin composition further comprises a filler (D); and
the filler (D) is contained in the resin composition in an amount from 50 to 1600 parts by mass per 100 parts by mass of the resin solid content.

9. The resin composition according to claim 1, wherein the cyanate ester compound (B) containing two or more aromatic moieties per molecule, the aromatic moieties being replaced by at least one cyanato group, further comprises at least one of a phenol novolac-type cyanate ester compound; a naphthylene ether-type cyanate ester compound; a bisphenol A-type cyanate ester compound; a bisphenol M-type cyanate ester compound; or a diallyl bisphenol A-type cyanate ester compound.

10. The resin composition according to claim 1, wherein the compound (A) represented by Formula (M1) is contained in an amount from 1 to 90 parts by mass and the cyanate ester compound (B) containing two or more aromatic moieties per molecule, the aromatic moieties being replaced by at least one cyanato group, is contained in an amount from 1 to 90 parts by mass when a resin solid content in the resin composition is 100 parts by mass;

the resin composition further comprises a filler (D);
the filler (D) is contained in the resin composition in an amount from 50 to 1600 parts by mass per 100 parts by mass of the resin solid content; and
the cyanate ester compound (B) containing two or more aromatic moieties per molecule, the aromatic moieties being replaced by at least one cyanato group, further comprises at least one of a phenol novolac-type cyanate ester compound; a naphthylene ether-type cyanate ester compound; a bisphenol A-type cyanate ester compound; a bisphenol M-type cyanate ester compound; or a diallyl bisphenol A-type cyanate ester compound.

11. The resin composition according to claim 1, wherein the compound (A) represented by Formula (M1) is contained in an amount from 1 to 90 parts by mass and the cyanate ester compound (B) containing two or more aromatic moieties per molecule, the aromatic moieties being replaced by at least one cyanato group, is contained in an amount from 1 to 90 parts by mass when a resin solid content in the resin composition is 100 parts by mass; and the cyanate ester compound (B) containing two or more aromatic moieties per molecule, the aromatic moieties being replaced by at least one cyanato group, further comprises at least one of a phenol novolac-type cyanate ester compound; a naphthylene ether-type cyanate ester compound; a bisphenol A-type cyanate ester compound; a bisphenol M-type cyanate ester compound; or a diallyl bisphenol A-type cyanate ester compound.

12. The resin composition according to claim 1, wherein the cyanate ester compound (B) containing two or more aromatic moieties per molecule, the aromatic moieties being replaced by at least one cyanato group, of a naphthol aralkyl-type cyanate ester compound.

13. The resin composition according to claim 1, wherein the compound (A) represented by Formula (M1) is contained in an amount from 1 to 90 parts by mass and the cyanate ester compound (B) containing two or more aromatic moieties per molecule, the aromatic moieties being replaced by at least one cyanato group, is contained in an amount from 1 to 90 parts by mass when a resin solid content in the resin composition is 100 parts by mass;

the resin composition further comprises a filler (D); and
the filler (D) is contained in the resin composition in an amount from 50 to 1600 parts by mass per 100 parts by mass of the resin solid content.

14. The resin composition according to claim 1, for a printed wiring board.

15. The resin composition according to claim 1, wherein the compound (A) represented by Formula (M1) is contained in an amount from 1 to 90 parts by mass and the cyanate ester compound (B) containing two or more aromatic moieties per molecule, the aromatic moieties being replaced by at least one cyanato group, is contained in an amount from 1 to 90 parts by mass when a resin solid content in the resin composition is 100 parts by mass;

the resin composition further comprises a filler (D);
the filler (D) is contained in the resin composition in an amount from 50 to 1600 parts by mass per 100 parts by mass of the resin solid content;
the cyanate ester compound (B) containing two or more aromatic moieties per molecule, the aromatic moieties being replaced by at least one cyanato group, further comprises at least one of a phenol novolac-type cyanate ester compound; a naphthylene ether-type cyanate ester compound; a bisphenol A-type cyanate ester compound; a bisphenol M-type cyanate ester compound; or a diallyl bisphenol A-type cyanate ester compound; and
the resin composition is for a printed wiring board.

16. A cured product of a resin composition described in claim 1.

17. A prepreg formed from a substrate and a resin composition described in claim 1.

18. A metal foil-clad laminate comprising at least one prepreg described in claim 17 and a metal foil disposed on one side or both sides of the prepreg.

19. A resin sheet comprising a support and a layer formed from a resin composition described in claim 1, the resin composition being disposed on a surface of the support.

20. A printed wiring board comprising an insulating layer and a conductor layer, the conductor layer being disposed on a surface of the insulating layer,
wherein the insulating layer comprises a layer formed from a resin composition described in claim 1.

21. The resin composition of claim 1, where the composition is substantially devoid of polymaleimide compounds except those represented by the formula M1.

22. The resin composition of claim 1, where the composition is substantially devoid of compounds represented by the formula 3M:

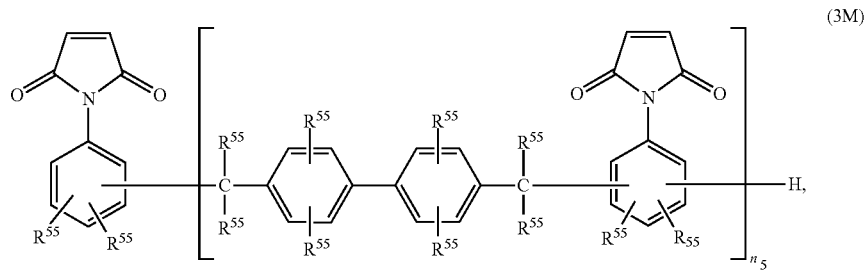

wherein each $R^{55}$ is independently a hydrogen atom, a methyl group, an ethyl group, a n-propyl group, an isopropyl group, a n-butyl group, an isobutyl group, a t-butyl group, a n-pentyl group, or a phenyl group, and where $n_5$ is an integer from 1 to 5.

* * * * *